United States Patent
Williams et al.

[11] Patent Number: 6,137,283
[45] Date of Patent: Oct. 24, 2000

[54] PROCESS AND MACHINE FOR SIGNAL WAVEFORM ANALYSIS

[75] Inventors: Michael K. Williams, 68 Springfield St., Wilbraham, Mass. 01905; Daniel J. Coffey, Westfield, Mass.

[73] Assignee: Michael K. Williams, Wilbraham, Mass.

[21] Appl. No.: 09/435,707

[22] Filed: Nov. 8, 1999

Related U.S. Application Data

[62] Division of application No. 08/393,307, Feb. 22, 1995.

[51] Int. Cl.$^7$ .................................................. G01R 25/00
[52] U.S. Cl. ................................ 324/76.12; 324/121 R; 702/69; 702/79
[58] Field of Search .................................. 702/79, 80, 70, 702/69; 324/76.42, 76.28, 76.38, 76.24, 76.15, 76.12, 121 R

[56] References Cited

U.S. PATENT DOCUMENTS

| | | |
|---|---|---|
| 3,725,785 | 4/1973 | Barrot et al. . |
| 4,350,953 | 9/1982 | Best et al. . |
| 4,540,938 | 9/1985 | Bruce . |
| 4,743,844 | 5/1988 | Odenheimer et al. . |
| 4,908,784 | 3/1990 | Box et al. . |
| 5,003,248 | 3/1991 | Johnson . |
| 5,128,607 | 7/1992 | Clark et al. . |
| 5,191,336 | 3/1993 | Stephenson . |
| 5,204,678 | 4/1993 | Foley . |
| 5,233,545 | 8/1993 | Ho et al. . |
| 5,260,670 | 11/1993 | Ainsworth et al. . |
| 5,262,714 | 11/1993 | Friedman ............................ 324/76.42 |
| 5,262,958 | 11/1993 | Chiu et al. . |
| 5,276,629 | 1/1994 | Reynolds . |
| 5,343,405 | 8/1994 | Kucera et al. . |
| 5,355,327 | 10/1994 | Stent . |
| 5,400,261 | 3/1995 | Reynolds . |
| 5,491,792 | 2/1996 | Grisham . |
| 5,495,168 | 2/1996 | de Vries . |
| 5,508,605 | 4/1996 | Lo ...................................... 324/76.42 |
| 5,528,134 | 6/1996 | Davis ................................ 324/76.38 |
| 5,646,955 | 7/1997 | Tozun et al. . |
| 5,764,524 | 6/1998 | Andersson et al. . |
| 5,793,642 | 8/1998 | Frisch et al. . |
| 5,828,983 | 10/1998 | Lombardi .......................... 324/76.38 |
| 5,841,286 | 11/1998 | Stoops . |

FOREIGN PATENT DOCUMENTS

| | | |
|---|---|---|
| 0 025 477 | 3/1981 | European Pat. Off. . |
| 0 561 169 | 9/1993 | European Pat. Off. . |

OTHER PUBLICATIONS

*Wave Technologies Corporation, DTS–2070 Digital Time Scope, Jan. 1996.

(List continued on next page.)

*Primary Examiner*—Safet Metjahic
*Assistant Examiner*—Jose M. Solis
*Attorney, Agent, or Firm*—Wolf, Greenfield & Sacks, P.C.

[57] ABSTRACT

Highly accurate time interval measurement is achieved for an electrical waveform. The electrical waveform is sampled and converted to a series of voltages, and the series of voltages is interpolated in order to form a time tag list, using interpolations that are optimized for time interval measurement and analysis. The time tag list accurately represents the times at which particular events of interest occur, and is used to generate displays and results analysis such as adjacent cycle jitter and accurate differential triggering and analysis.

25 Claims, 18 Drawing Sheets

OTHER PUBLICATIONS

*Hewlett Packard Company: HP 54700–Series Modular Oscilloscopes, Technical Data, Nov. 1993.

*Hewlett Packard Company: Time Interval Analyzer For Data Storage, Configuration Guide And Technical Specification, Sep. 1994.

Stephenson, "Frequency and Time Interval Analyzer Measurement Hardware," Hewlett Packard Journal, Feb. 1989, pp. 35–41.

Williams, "M1 Technical Case Studies," ASA Tech Brief 96–01, Jan. 1995.

"M1 Time–Interval Measurement Software" ASA data sheet, Jan. 1994.

Williams, "Design Tradeoffs in High–Speed Clock Distribution and Reception," Presented at Jan. 1993 High Speed Digital Symposium.

Williams, "The Measurement and Management of Jitter on Critically Times Signals," Jan. 1995.

Williams, A Discussion of Methods for Measuring Low–Amplitude Jitter, Jan. 1995 IEEE, International Test Conference.

Williams, "Accuracy in MI/720 Time–Interval Measurement Systems" CASA Tech Brief 95–38 Jan. 1995.

Williams, "Clock Design in Intel Pentium Processor Systems using the SC3508," AMCC Application Note #3 Jan. 1993.

Williams, "Distortion Tolerance in High–Speed Clock Delivery," Jan. 1993 High Speed Digital Symposium.

Williams and Paulson, "Timing Considerations in Clock Distibution Networks," Jan. 1992 High Speed Digital Symposium.

Williams and Pfaff, "Clock Design and Measurement Issues in Pentium Systems, " Dec. 1994 Hewlett–Packard Journal.

PROCESS AND MACHINE FOR SIGNAL WAVEFORM ANALYSIS

This application is a divisional of application Ser. No. 08/393,307, filed Feb. 22, 1995, entitled TIME INTERVAL MEASUREMENT APPARATUS AND METHOD, and now pending.

BACKGROUND OF THE INVENTION

1. Field of the Invention

This invention relates generally to the field of signal measurement, and in particular to accurate measurement and analysis of time interval related parameters of periodic signals such as electronic clock signals.

2. Discussion of the Related Art

Time interval related parameters of an electrical signal generally include period, pulse width, rise time, fall time, and frequency. These and other related features of the signal are measured from a system under test. Typically, the signal is periodic. Since the signal very often is not ideal, however, variations of the period, pulse width, frequency, and other parameters are indicative of the overall waveform stability of the signal. These variations are referred to as jitter. There are currently two types of equipment available for the analysis of signals to determine time interval related parameters and waveform stability.

The first type of equipment includes oscilloscopes. Generally, oscilloscopes operate by monitoring time windows of a waveform, and displaying portions of the monitored time windows. For example, an oscilloscope may be set to trigger on a particular voltage threshold of a waveform. As seen in FIG. 20, the oscilloscope monitors the waveform 200 during a first time window 202 and displays the beginning of the waveform 204 during the first time window 202, from the time that the set threshold was detected. There is a dead time 203, then the oscilloscope monitors the waveform during a second time window 206, and displays the part of the waveform 208 from the second time window 206 beginning at a time when the set threshold was detected. This sequence is repeated many times very quickly, for example for a third time window 209, so that a human eye does not detect that there is a dead time 203, 205 in between monitored time windows. Dead time may also be referred to as re-arm time, since it is often the time that it takes for the oscilloscope to re-arm the trigger.

A user views the display that includes parts of the waveform overlayed on one another, and interprets certain parameters. For example, as shown in FIG. 21, the time between two sequential rise times determines the period of the waveform 212. Since very often the waveform is not perfect, the display of the oscilloscope shows a number of lines that correspond to a number of instances of a rising edge of the waveform, shown at 214 in FIG. 21. The lines may be from a reconstruction of a digital waveform, or a composite of discrete points. The interval between the leftmost edge of the second rising edge and the rightmost edge of the second rising edge is referred to as jitter, shown as 216. In FIG. 21 the jitter appears as a time interval, although it actually represents a variation of the rise times among several cycles. Jitter may refer to any time variation of a waveform parameter, and is also called waveform stability. Other examples include period jitter, pulse width jitter and frequency jitter. Jitter may be instantaneous and vary significantly from cycle to cycle, or be long-term in that the jitter itself has behavioral characteristics that vary over time. Jitter is a critical parameter with respect to waveform analysis since it represents, among other things, the overall uniformity of the waveform. This measurement may be especially critical in very high speed processing applications.

There are many sources of error within an oscilloscope that adversely affect the accuracy of measurements such as jitter. As described above, the dead times 203, 205 may cause inaccuracies in jitter measurement, because the dead time 203, 205 represent many instances of cycles of the waveform that are simply not analyzed by an oscilloscope. Furthermore, the view observed on the display only represents a part 204 of the window 202 that was monitored. Therefore, the display is representative of only a fraction of all of the cycles of the waveform that occurred during the measurement and display time. Additionally, since the display is a composite of many rising and falling edges, it is not possible to determine with certainty from the display the characteristics of adjacent cycles, even though behavior of adjacent cycles can be extremely important.

Another source of error within oscilloscopes is referred to as trigger jitter or trigger interpolation jitter. In a digitizing oscilloscope, the waveform is first converted into a series of voltages. The series of voltages is then interpolated to provide a continuous voltage waveform to be displayed. However, since the waveform is being interpolated, the point at which the waveform crosses the trigger threshold must also be interpolated, so that the actual trigger point is the result of an interpolation. Accordingly, even the very best real time oscilloscopes have up to 36 picoseconds of error in a jitter measurement from trigger interpolation alone. Other less expensive equipment will have much more interpolation jitter error.

Oscilloscopes may be either real-time or equivalent-time. In real-time oscilloscopes, another source of error of time interval related parameters is sample clock jitter. The digital oscilloscopes perform analog to digital conversions that are triggered by a clock pulse. If the clock pulse used to trigger the analog to digital conversion is inaccurate, then the voltage converted at the time of the clock pulse will reflect this inaccuracy. Equivalent-time oscilloscopes can be more accurate, but not on a cycle to cycle basis, since the resulting display is a composite of several windows of measurement. Furthermore, an equivalent-time oscilloscope relies on several trigger events for one waveform representation, and may add error for each trigger event.

Another source of error for both real-time and equivalent-time oscilloscopes is front end analog noise, which is the noise inherent in the analog portions of the oscilloscope. Quantization error also adds to the total error, since an analog-to-digital converter will have a finite number of bits with which to represent the voltage of the waveform at a particular point. Error is also inherent in the creation of the signal display. This error, referred to as digital signal processing error, may be a result of imperfect interpolation, or other inaccuracies in the creation and interpretation of the signal display. As with most discrete time systems, aliasing is also a source of noise. Finally, there is error in reconstruction and interpolation from the quantized data, once it is to be displayed on the scope.

While trigger interpolation jitter alone may provide 36 or more picoseconds of noise, each of the sources of error described above combine to create a composite error. As a result of this composite error, the resulting accuracy of even the highest quality currently-available oscilloscopes is in the range of 50 picoseconds or greater.

A second type of equipment commonly used for time waveform analysis includes time interval analyzers. A time interval analyzer is essentially a very fast running counter, connected to a threshold and slope detector which monitors a waveform. A user selects a threshold and slope, and each time the selected threshold and slope is detected, the counter triggers and the time at which the slope is detected is recorded as the corresponding value of the counter at that time. The time interval analyzer performs analysis on the resulting series of trigger points.

There are several sources of error within a time interval analyzer. A large source of error is the front end analog circuitry, which is highly subject to noise. Another source of error is the counter itself, since the accuracy of the counter is highly dependent upon a clock which runs the counter. Additionally, a trigger event may occur between clock pulses to the counter, and the counter rounds off to either the preceding or following counter value. These sources of error often combine to provide approximately 600 picoseconds of jitter, even within-the highest quality currently-available time interval analyzers.

SUMMARY OF THE INVENTION

This invention is directed to improving accuracy in signal waveform analysis. By capturing waveform data and very accurately generating a time tag list corresponding to occurrences of an event of interest, trigger interpolation error is significantly reduced. The time tag list is generated accurately by either linearly interpolating a series of samples that represents the waveform data, or upsampling the series of samples and interpolating the upsampled series to determine the time tags. In one embodiment of the invention, a plurality of interpolation filters are available. One of these filters, referred to as a time optimal filter, is optimized for accurately reproducing the rising and falling edges of the waveform.

The time tag list may be used to display occurrences of the event of interest as well as statistics of the event of interest. Therefore, an embodiment of the invention achieves analysis of adjacent cycles of a waveform of interest. Another embodiment facilitates determining relative zero crossings between two differential signals. Another embodiment displays a jitter spectrum, which corresponds to the frequency spectrum of the waveform jitter.

An illustrative embodiment of the invention is a method for analyzing time interval data of a waveform, including converting the waveform into a series of digital words, each word of the series of digital words representing a voltage of the waveform and a sample time at which the voltage occurred, selecting an event of interest defined by a characteristic of the waveform, and interpolating the series of digital words to generate a time tag list, the time tag list including a series of time tags, each of the series of time tags representing a time at which the event of interest occurred.

Further embodiments include steps of upsampling the series of digital words to create an upsampled series of digital words, determining a first digital word and a second digital word of the upsampled series of digital words that surround the threshold voltage and performing linear interpolation between the first digital word and the second digital word to determine a time tag corresponding to the event of interest. The waveform may include a plurality of cycles, each of the plurality of cycles having a rising edge and a falling edge, and the step of upsampling may include providing a filter having characteristics that are optimized to accurately recreate the waveform at each rising edge and each falling edge, inserting a digital word with a zero value between each adjacent pair of digital words in the series of digital words, to create a zero-valued series of digital words, and filtering the zero-valued series of digital words according to the filter, to create the upsampled series of digital words.

Further embodiments include determining statistical properties of the time tag list, displaying the time tag list and the statistical properties of the time tag list in one of a basic mode and a deviation mode as one of a line graph, text, a histogram, and a jitter spectrum. The step of selecting an event of interest may include steps of selecting a parameter to be analyzed to be one of period, pulse width, frequency, and delay. The step of selecting an event of interest may further include one of specifying a threshold voltage, selecting a predetermined voltage to be one of a standard TTL voltage, a 3.3 Volt TTL voltage, a standard ECL voltage, a positive ECL voltage, a shifted ECL voltage, and a ground voltage, and selecting multiple threshold voltages of 0.8 volts, 1.5 volts, and 2.0 volts, each of which represents an event of interest.

In further embodiments, locally synthesized data is created and interpolated.

In another embodiment, inter-acquisition analysis is performed on different waveforms or different acquisitions of the same waveform.

An apparatus embodiment includes a measurement control unit, that has an input for receiving the waveform and an output providing an input file, the input file including a series of digital words, each of the series of digital words representing a voltage of the waveform and an input time at which the voltage occurred a time tag interpolator, having an input coupled to the measurement control unit for receiving the input file, and an output providing a time tag list according to an interpolation, the time tag list including a series of time tags, each of the series of time tags representing an output time at which the event of interest occurred during the waveform and a results analyzer, having an input coupled to the time tag interpolator for receiving the time tag list, and an output that provides the series of time tags and statistics of the series of time tags.

Another apparatus embodiment includes means for converting the waveform into a series of digital words, each word of the series of digital words representing a voltage of the waveform and a sample time at which the voltage occurred, means for selecting an event of interest defined by a characteristic of the waveform, and means for interpolating the record to generate a time tag list, the time tag list including a series of time tags, each of the series of time tags representing a time at which the event of interest occurred during the waveform.

Another method embodiment for interpolating a discrete time series that represents voltages of a waveform includes upsampling the discrete time series to create an upsampled discrete time series, determining a first digital word and a second digital word of the upsampled series of digital words that surround the threshold voltage, and performing linear interpolation between the first digital word and the second digital word to determine a time tag corresponding to the point at which the waveform crosses the threshold voltage.

Another embodiment is an apparatus for interpolating a discrete time series that represents voltages of a waveform, including means for upsampling the discrete time series to create an upsampled discrete time series, means for determining a first digital word and a second digital word of the upsampled series of digital words that surround the threshold voltage, and means for performing linear interpolation between the first digital word and the second digital word to determine a time tag corresponding to the point at which the waveform crosses the threshold voltage.

BRIEF DESCRIPTION OF THE DRAWINGS

Other features and advantages of the present invention shall appear from the following description of an exemplary embodiment, said description being made with reference to the appended drawings, in which.

DETAILED DESCRIPTION

This specification describes several embodiments of the invention. The description addresses the manner in which an embodiment of the invention may interact with external systems. A detailed description of a process in accordance with the invention follows. Examples of displays are also described, followed by a description of a circuit embodiment, and sample files.

Figure 1:
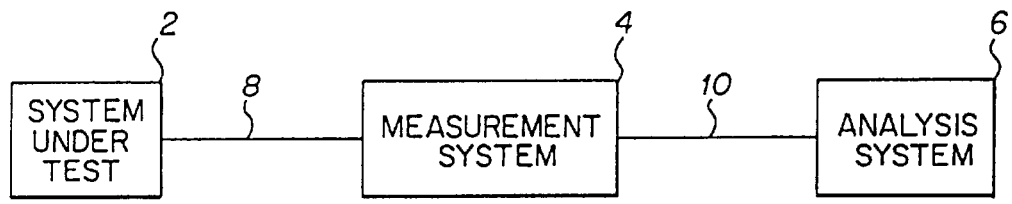
FIG. 1 shows an embodiment of the invention.

FIG. 1 shows an illustrative embodiment of the invention. In FIG. 1, a system 2 under test is coupled to a measurement system 4 by a data interface 8. Measurement system 4 may be, for example, a Hewlett-Packard 54700 series modular oscilloscope. Alternatively, any source of data is within the scope of this invention. For example a computer file containing data may represent the input. Data interface 8 may be a single scope probe, multiple scope probes, differential scope probes, current probe, or any data capture element used to transfer data to measurement system 4. A scope probe is used to monitor a voltage signal in order to transfer information, normally in the form of an analog voltage signal, to the measurement system 4. A scope probe is physically connected to a point on the system 2 under test, which is electrically connected to a terminal which carries the waveform of interest. This physical connection also makes an electrical connection, so that some current flows into the scope probe. Normally, it is desired that a scope probe have a very high impedance including a high resistance and a low capacitance, so that current flows through the probe are minimized. In this manner, adverse affects on the waveform signal itself from the scope probe are minimized. From this very small amount of current, a scope probe generates a stronger signal, representative of the voltage of the signal being monitored, and transfers the amplified signal to measurement system 4, for example a digital oscilloscope or a special purpose analog to digital converter.

In this embodiment, an analysis system 6 is coupled to the measurement system 4 by an interface bus 10. In this embodiment, the interface bus 10 may, for example, be a Hewlett Packard Interface Bus (HPIB), available from Hewlett packard, or General Purpose Interface Buss (GPIB), available from Hewlett Packard, Tektronix, and National Instruments, among others.

Figure 2:
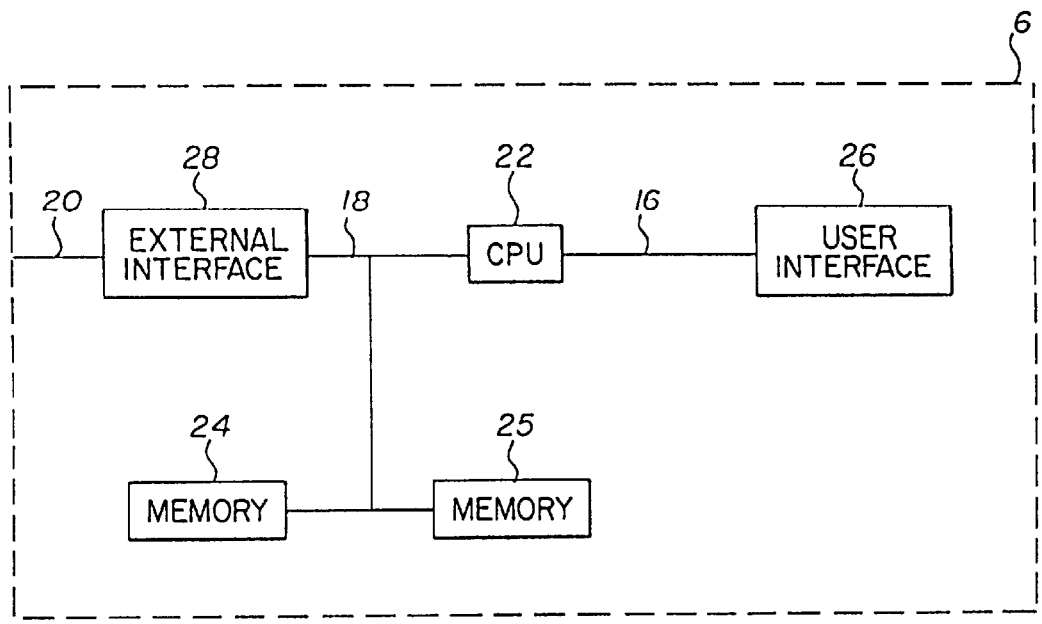
FIG. 2 shows an a block diagram of an embodiment of the invention.

FIG. 2 shows an embodiment of the analysis system 6, in which a central processing unit (CPU) 22 is coupled to memory 24, memory 25 and external interface 28 by a processing bus 32. The CPU 22 typically includes a microprocessor and control logic. It is foreseeable that optical computers will become available with similar capabilities. The data to be processed by the analysis system 6 may be data that was stored in one computer, stored indefinitely, and transferred to another analysis system 6. Furthermore, the data may be processed multiple times. The memory 24 and memory 25 each may be a hard drive, floppy disk, electronic memory such as random access memory (RAM), erasable programmable read only memory (EPROM), Electrically Erasable Programmable Read Only Memory (EEPROM), magnetic, optical, or magneto-optical recording media, or tapes and other non-volatile linear access media, or a combination of these. Typically, memory 24 is a volatile, random access memory, which may be either static or dynamic, and memory 25 is non-volatile memory such as a hard drive. Alternatively, a single memory unit may suffice. The external interface 28 provides an interface port 34 which may be coupled to the interface bus 10. A user interface 26 is coupled to the CPU 22 via a user interface bus 30. In one embodiment the user interface 26 may be a computer display, keyboard, and mouse. The user interface 26 is typically a physical entity by which the user inputs commands to and receives information from the CPU 22. The user interface 26 may be a keyboard, mouse, touch screen, joystick, trackball, touchpad, or a communication device such as a network, network interface, modem, etc. Normally, a display represents the primary output of CPU 22, but printed media and electronic output may also be used. Display devices include video displays, such as liquid crystal displays (LCD's), cathode ray tube (CRT) displays, and other displays.

If the invention is used in a client-server relationship, the user interface 26 may also provide electronic interface to a master computer. In such an embodiment, the master computer is the user, and may provide the commands and responses that are discussed with respect to a user. The analysis system 6 may be implemented in any general purpose processor, and in this embodiment is a personal computer such as an IBM 486 PC with a standard Hewlett-Packard HPIB instrument board as the external interface 28. The IBM 486 personal computer includes a DOS operating system and a WINDOWS environment, and is capable of supporting programming languages such as C++.

Figure 3:
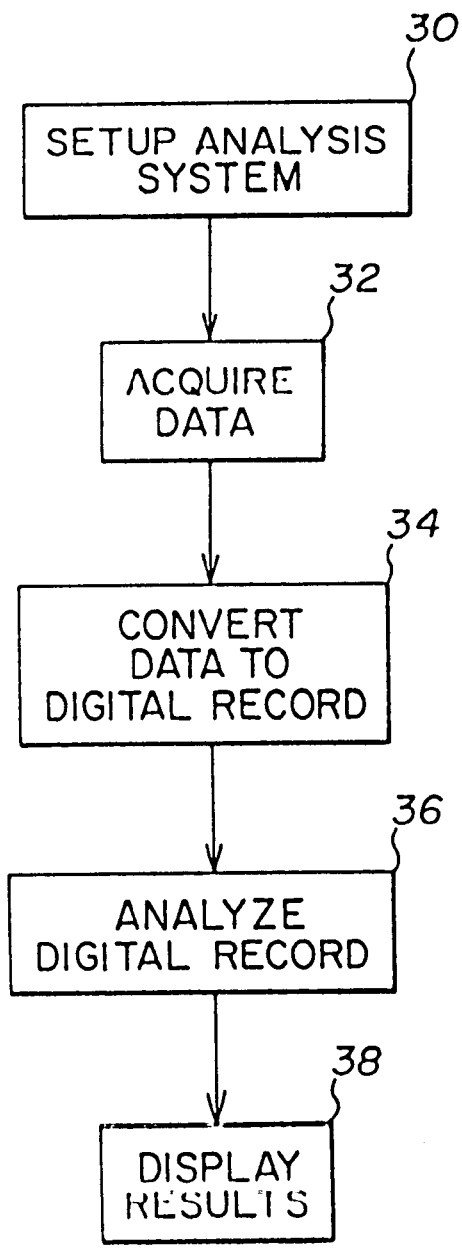
FIG. 3 shows steps of a process embodiment of the invention.

FIG. 3 is a flowchart that describes a process in accordance with the invention. FIG. 3 may be interpreted with respect to FIG. 1. In step 30, the user or an external system sets up the analysis system. The system 2 under test provides electrical signals which are of interest. These signals, normally analog signals, are acquired by the measurement system 4 in step 32, and are converted into an information record in step 34. This information record may be in the form of a computer file, and may contain data organized as an array. Generally, the waveform is a periodic wave such as a sine wave or a sequence of pulses. Often, such a waveform contains characteristics which make the waveform imperfect, such as peak variations in amplitudes or pulse widths. A sequence of pulses is a time series in which the signal voltage alternates between a high voltage and a low voltage. Ideally, such a waveform is a perfect pulse train. However, characteristics may vary, especially at very high frequencies. These characteristics include frequency variations, pulse width variations, period variations, and the like.

The information record generated in step 34 includes a series of voltages represented as discrete digital signals of a number of bits commonly referred to as a word. The series of digital words may also be called samples. Each of the samples in the series is associated with a time at which the waveform was converted into one of the samples. For example, if the measurement system 4 is set to a sampling rate of 2 GHz, then an exemplary record ideally would include a sequential list of 250,000 samples, corresponding to 250,000 voltages measured over a period of 125 microseconds. The number of actual points in a record, however, is dependent upon several factors. In the example, each subsequent sample in the sequential list would represent the voltage measured 0.5 nanoseconds after the previous voltage. The analysis system analyzes the record in step 36, and displays the results in step 38. FIG. 29 also shows an example of a record of discrete voltages.

Figure 3A:
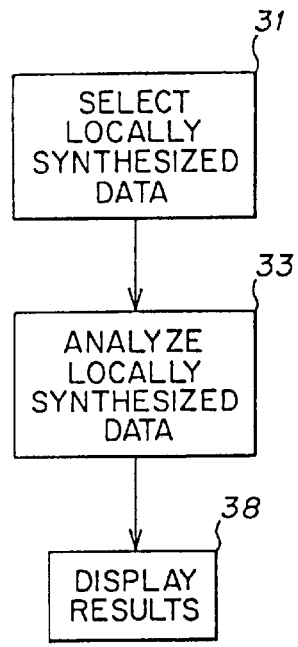
FIG. 3A shows steps of an alternate process embodiment of the invention.

FIG. 3A shows an embodiment in which locally synthesized data is also available for analysis. These steps may be performed after the step 30 of setting up the analysis system. Locally synthesized data, which may be pre-stored is selected in step 31. The locally synthesized data is analyzed in step 33, in the same manner as the digital record is analyzed in step 36. In step 38 the results are displayed, so that a user may determine the validity of the parameters that were set in step 30. For example, as will be explained in more detail below, a user may select one of several filters. Therefore, the user may desire to view the results of the different filters on an ideal waveform such as the locally synthesized data.

Figure 3B:
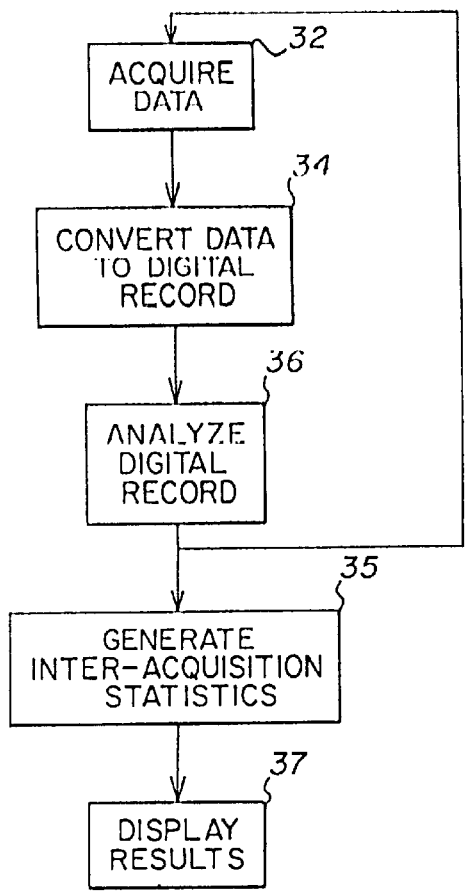
FIG. 3B shows steps of another process embodiment of the invention.

FIG. 3B shows an embodiment in which step 32, step 34, and step 36 are repeated for several different waveforms, or for the same waveform at different times. Inter-acquisition statistics are generated in step 35 and results are displayed in step 37. Inter-acquisition statistics may be the results of statistics processing being performed on the statistics generated from several waveforms.

Figure 4:
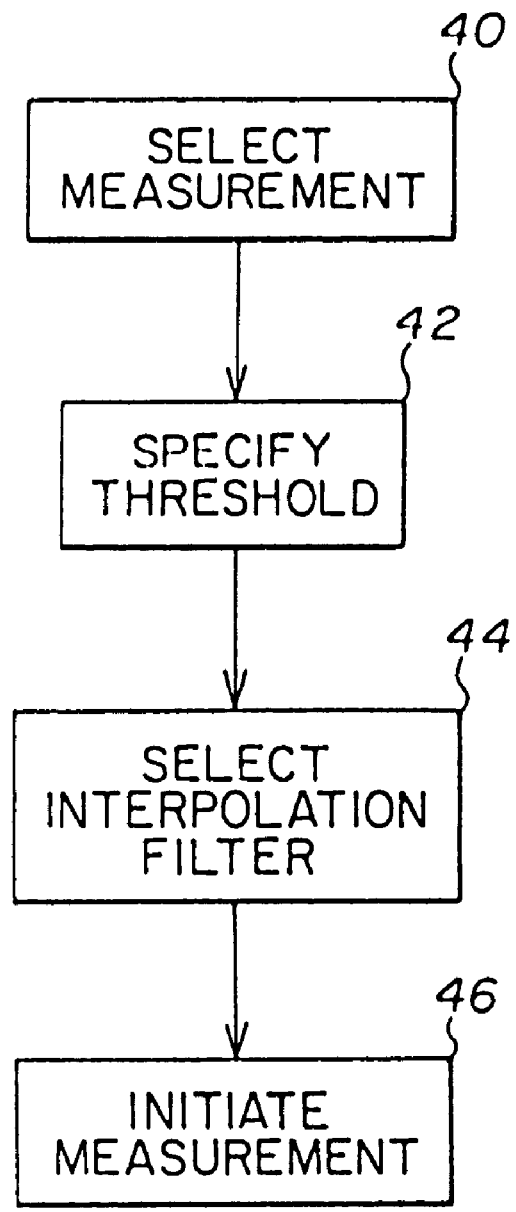
FIG. 4 shows further detail of step 30 shown in FIG. 3.

Exemplary details of step 30 of FIG. 3 are shown in FIG. 4. FIG. 4 shows step 40 of selecting a measurement, step 42 of specifying a threshold, step 44 of selecting an interpolation filter, and step 46 of initiating measurement. These steps serve to select an event of interest. An event of interest may, for example, be each time that the voltage of the waveform crosses 0.4 Volts while having positive slope. Positive slope simply means that the voltage is increasing at the time that the threshold is crossed.

Figure 5:
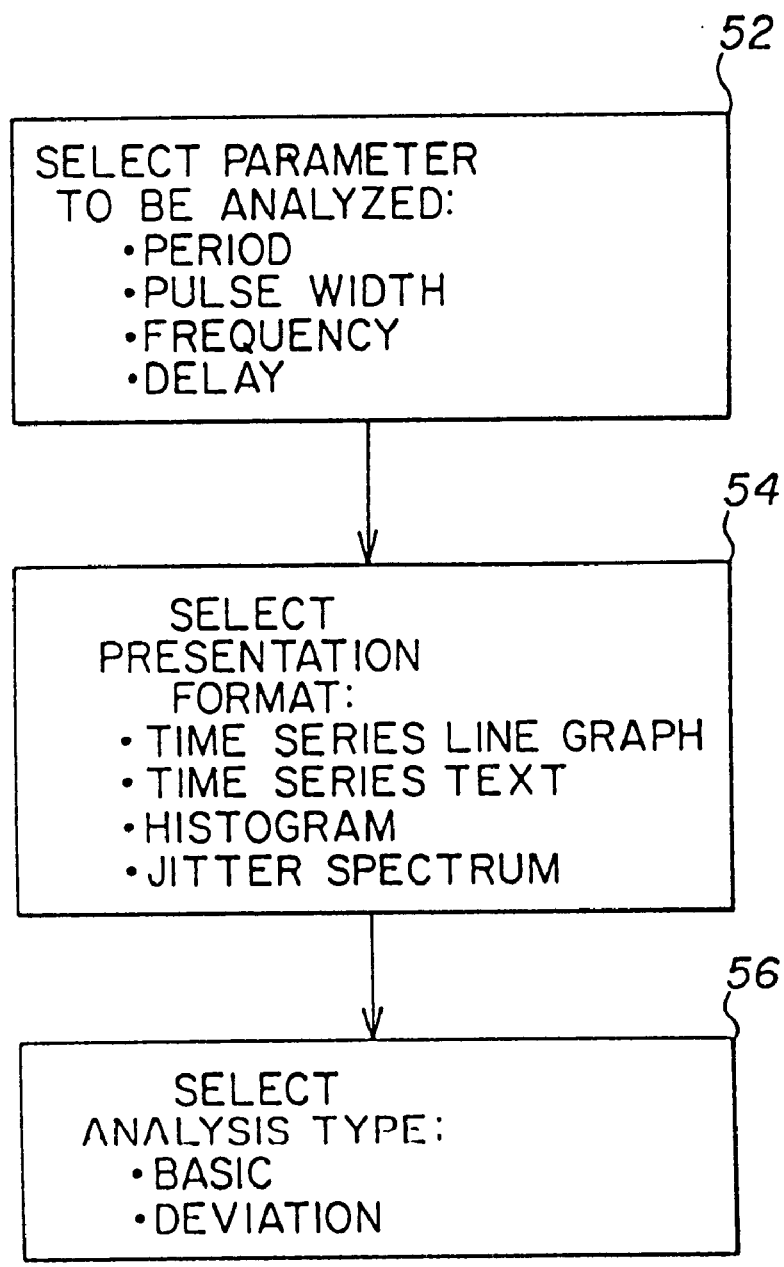
FIG. 5 shows further detail of step 40 shown in FIG. 4.

Exemplary details of step 40 are shown in FIG. 5. In step 52, a parameter to be analyzed is selected. For example, period, pulse width, frequency, or delay may be selected. A presentation format is selected in step 54. The presentation format may include, for example, a time series line graph, a time series text, or a histogram. In step 56 an analysis type is selected, normally either basic or deviation. A jitter spectrum may also be selected, in step 54, in order to display frequency components of the jitter parameters. The frequency components of the jitter parameters may be determined, for example, by transforming a time-domain signal that represents the jitter parameter into a frequency-domain signal.

Figure 6:
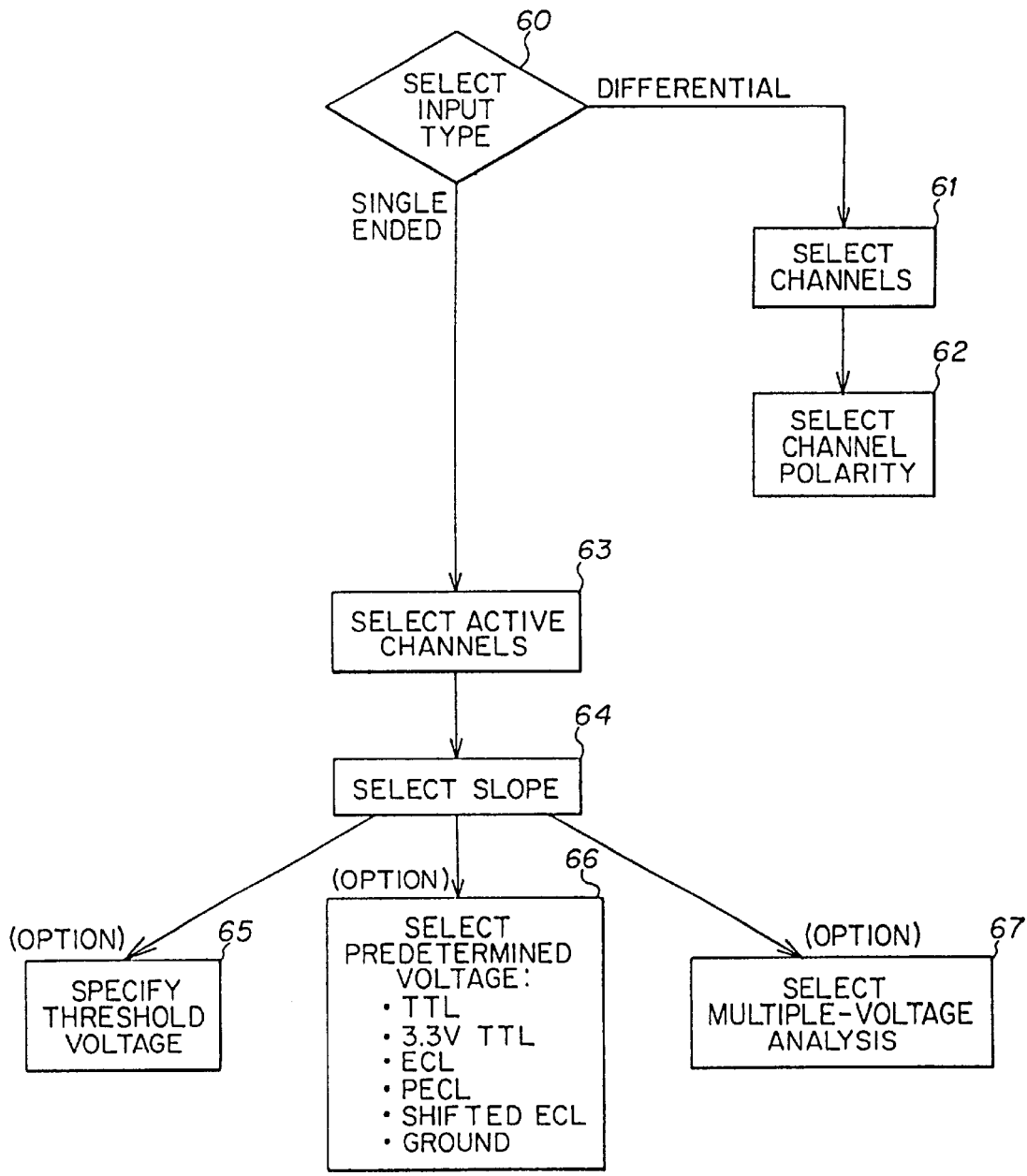
FIG. 6 shows further detail of step 42 shown in FIG. 4.

FIG. 6 shows exemplary details of step 42 of specifying threshold. In step 60, a user may select the input type to be either differential or single ended. If a differential input is selected, channels are selected in step 61 for the differential measurement, and channel polarity is selected in step 62 for each channel selected in step 61. If single ended input is selected in step 60, then in step 63 the channels to be active during measurement are selected. For single ended measurements, a slope for each channel is selected in step 64. Following step 64, the user may specify in step 65 a particular threshold voltage, or in step 66 may select a predetermined voltage, or in step 67 may select multiple voltage analysis. Steps 65, 66, and 67 are shown as optional steps, since alternatively a default may be used.

Among the voltages which may be selected are:

a standard transistor transistor logic (TTL) voltage;

a 3.3 Volt TTL voltage a standard emitter coupled logic (ECL) voltage;

a positive ECL voltage;

a shifted ECL voltage; and a ground voltage.

Furthermore, multiple voltages may be selected, in order to have each analysis performed on the same waveform for each voltage. In one embodiment, these voltages are 0.8 volts, 1.5 volts, and 2.0 volts. As a result, for example, if the selected statistic for analysis were the period of the waveforms, then for one waveform in a processing sequence, the period of the waveform would be analyzed three times, once with respect to each of 0.8 volts, 1.5 volts, and 2.0 volts. This capability is of special utility in order to test circuitry when the requirements for the circuitry specify parameters to be validated for multiple voltages. The multiple voltage feature makes validation of such circuitry much easier, because only a single measurement is required.

Figure 7:
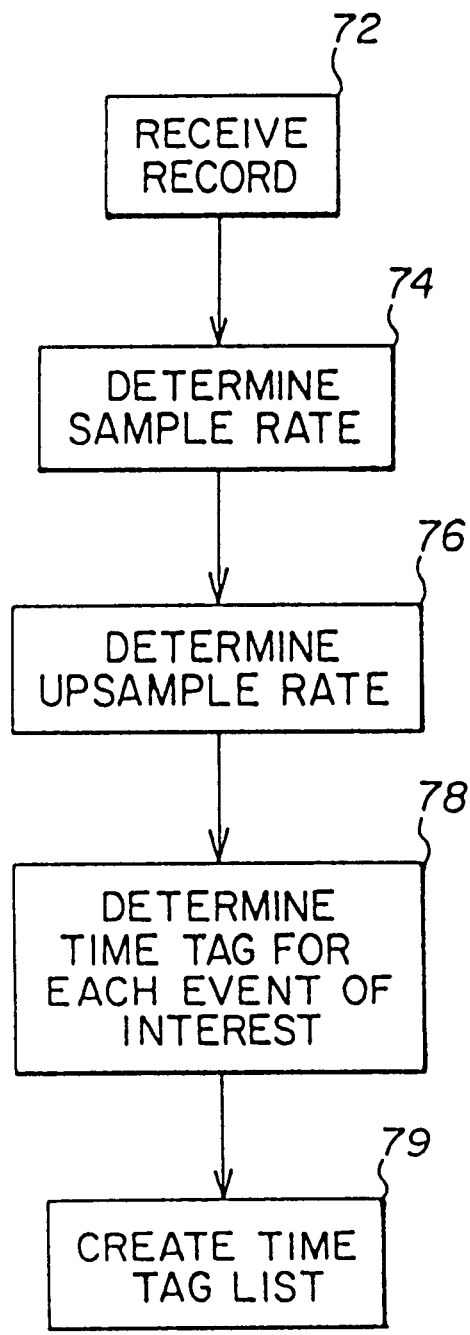
FIG. 7 shows further detail of step 36 shown in FIG. 3.

Referring back to FIG. 3, steps 32 and 34 of acquiring data and converting the data to a digital record may utilize any conventional method. Further detail of step 36, analyzing the digital record, is shown in FIG. 7. FIG. 7 shows step 72 of receiving the record, which is a list of voltages, and step 74 of determining the average sample rate. The inverse of the average sample rate is the amount of time between two adjacent samples within the record. In step 76, the upsample rate is determined, which is dependent upon the type of filter selected. The upsample rate is also referred to as the interpolation ratio. A time tag for each event of interest within the record is determined in step 78. An example of an event of interest is a voltage or a current threshold crossing with a positive slope. In this example, the time tag list generated in step 79 would include a list of times, each time representing the relative time at which the waveform of interest crossed the selected voltage threshold while increasing, i.e. with positive slope. The time tag list is used to display results as in step 38 of FIG. 3, which will be discussed in more detail below.

Figure 8:
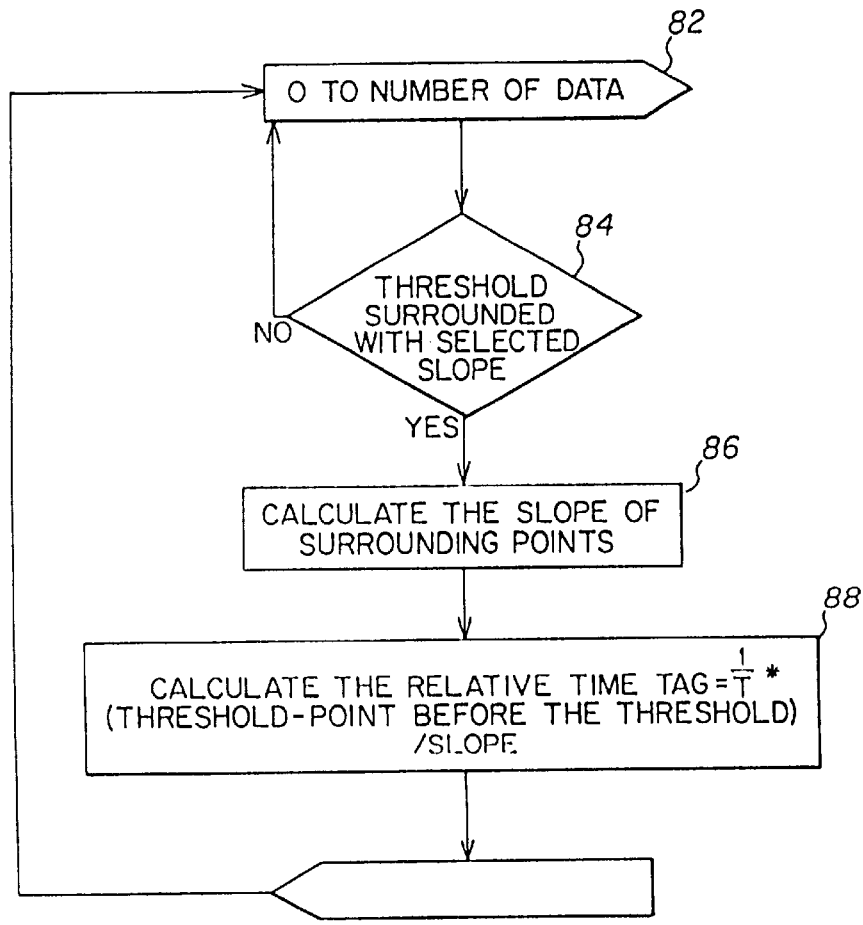
FIGS. 8, 9, 10, and 11 show embodiments of step 78 shown in FIG. 7.

FIG. 8 shows the steps performed within step 78 for the instance in which a linear interpolation filter is selected for a single ended measurement. In step 82, the process is controlled to continue until all data points of the record are analyzed. In step 84, the first and second data points are analyzed to determine whether they surround the selected threshold with the selected slope. In this context, two data points surround the selected threshold if one of the two data points has a magnitude greater than the selected threshold, and the other of the two data points has a magnitude less than the selected threshold. Furthermore, if the selected slope is positive, then the first of the two data points is normally the data point that has a magnitude less than the selected threshold. Similarly, if the selected slope is negative, then the first of the two data points is normally the data point that has a magnitude greater than the selected threshold. If the two data points surround the selected threshold with the selected slope, the slope between these points is calculated in step 86, which represents the difference between the points multiplied by the sampling frequency, since the difference in time between two adjacent points is the sampling period, or the inverse of the sampling frequency. Then, in step 88, the relative time tag of the threshold crossing is determined to be the difference between the threshold and the voltage of the first data point, divided by the difference between the first two points, further divided by the frequency of the input samples. The relative time tag is added to the time at which the first data point was sampled to create an actual time tag. The interpolation may be represented by the following equation, in which VTH is the threshold voltage, V1 is the voltage of the first data point, V2 is the voltage of the second data point, and FS is the sampling frequency:

$$\text{relative time tag} = \frac{VTH - V1}{(V2 - V1)(FS)}$$

If the first and second points do not surround the selected threshold, then step 84 is repeated until a pair of data points is located which do surround the threshold. Steps 86 and 88 are normally performed for each pair of data points which surround the threshold.

An example is given in order to clarify these steps. In the example, the selected slope is positive, and the selected threshold is 4 Volts. The first data point is 3.5 Volts occurring at time=10 nanoseconds, and the second data point is 5 Volts occurring at time=10.5 nanoseconds. Accordingly, the first data point and the second data point would be considered to surround the threshold with the selected slope, since the value of 4 is crossed if a continuous waveform increases from 3.5 to 5. Since the sampling rate is 2 GHz, the relative time tag would be determined to be (4−3.5)/((5−3.5)*2)= 0.166. The actual time tag would be 0.166 nanoseconds following the time at which the first data point was sampled. Therefore, the actual time tag is 10.166 nanoseconds.

Figure 9:
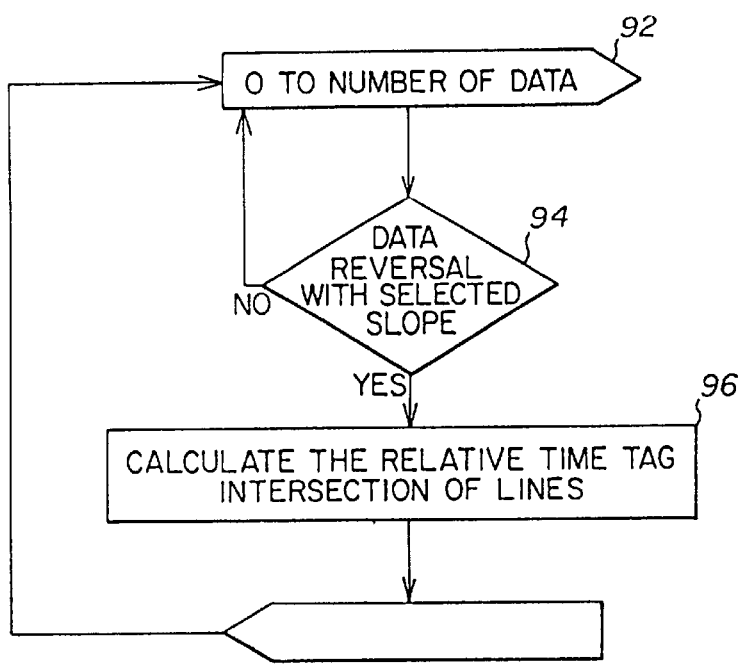

FIG. 9 shows the steps performed within step 78 for the instance in which a linear interpolation filter is selected for a differential measurement. In such an instance, the process is controlled in step 92 so that each data point is examined. Each data point in a differential measurement situation includes two voltages, one from each channel. In step 94 a data reversal between any two adjacent data points may be detected. The data reversal represents a period start point in a differential signal. A data reversal may be defined as a point at which the difference between two signals either crosses from negative to positive or from positive to negative. In a differential signal, the signals in both channels may vary, so that the event of interest is commonly this point at which the two signals on each channel cross in amplitude. Alternatively, the event of interest may be a relative threshold crossing between two signals. If there has been a data reversal, in step 96 the relative time tag is determined by linearly interpolating the intersection of two lines that represent the voltage of the two channels, and dividing the result by the frequency of the input samples.

For example, if a first data point defines channel 1 at 4 Volts and channel 2 at 1 Volt, and a second data point defines channel 1 at 2 Volts and channel 2 at 3 volts, a data reversal is said to have occurred with negative slope. In this example, the relative time tag would be equal to the time at which the line defined by the two samples of channel 1 intersect with the line defined by the two samples of channel 2. If the two lines are represented by the formula y=mx+b, then the first line is represented by y=−2x+6, and the second line is represented by y=2x−1. The intersection is obtained by solving for x when the values for y is equal. In this instance, if the first data point occurred at 1 nanosecond and the second data point occurred at 2 nanoseconds, this yields the relative time tag of 0.75 nanoseconds, and an actual time tag of 1.75 nanoseconds.

Figure 10:
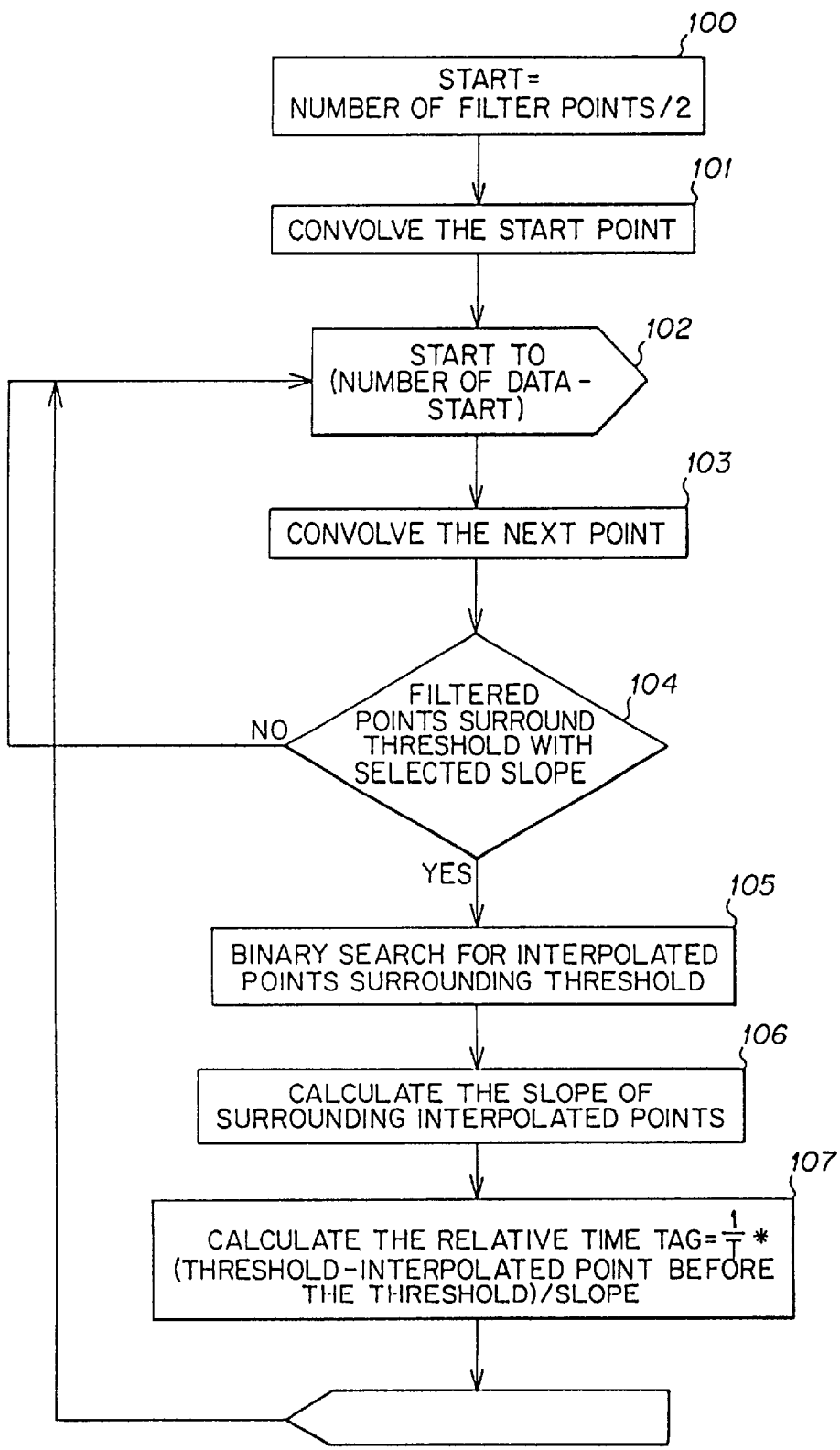

FIG. 10 shows the steps performed within step 78 for the instance in which a hybrid interpolation filter or a time optimal filter is selected. The hybrid interpolation filter is very useful because it combines the accuracy of a sin(x)/x interpolation with the speed of a linear filter. The hybrid interpolation filter upsamples the frequency at which the waveform was sampled in order to create additional data points. Then, the additional data points are treated as the actual data points were treated in the linear interpolation filter described above. Alternatively, several upsamples may be performed recursively in order to create the additional samples.

In general, a digital filter may be used to generate additional data points by providing additional zero samples interspersed between the actual time samples. When samples are passed through a low pass filter and sampled at the higher rate (the resulting rate when the interspersed zero samples are included) the filter will yield additional samples at the points where the zero samples, were input.

Conceptually, interspersing zero values adds additional components in the frequency domain. Therefore, the series which includes the zero values will have a several spectral densities, each with a width half of the initial density, assuming only one zero was interspersed between each pair of actual input points. The low pass filter removes the additional spectral densities so that only one of the spectral densities remains, and an inverse discrete transform may be performed on only the lower of the two spectral densities. In this manner, if 8 actual time samples were provided with 8 zero samples to a 16 point filter, the result would be 16 data points in the time domain. If 4 actual time samples were provided with 12 zero samples, the result would also be 16 points in the time domain. These 16 points are considered a more accurate representation of a waveform. Accordingly, linear interpolation performed between these 16 points will be more accurate than linear interpolation performed between the original 8 points.

Since the unit response in the time domain of a low pass filter is a waveform with the general characteristics of an equation y=sin(x)/x, this upsampling method is called sin (x)/x interpolation. However, there are many different low-pass filters in existence, and several different ways to implement each of them. Therefore, among other aspects of this embodiment, the characteristics of the selected filters as well as the implementation makes this embodiment very advantageous compared to what is currently available.

One embodiment includes a 5-point hybrid filter, which includes 500 filter coefficients representative of a sin(x)/x plot. For the 5-point hybrid filter, four zeros may be inserted between each pair of adjacent input samples in an input series, for an effective upsampling of 5.

An embodiment of the 25-point hybrid filter includes 2500 filter coefficients representative of a sin(x)/x plot. For the 25-point filter, twenty-four zeros may be inserted between each pair of adjacent input samples in the input series, for an effective upsampling of 25.

An embodiment of the time-optimal filter includes 25,000 filter coefficients. In this embodiment, two hundred forty-nine zeros are inserted between each input voltage in the input series. Although the 25,000 point filter could be implemented with a convolution machine containing a 25,000 element shift register, 25,000 multipliers and a 25,000 input adder, the multipliers would not be needed for the zero values, since the zero values multiplied with any coefficient would still yield zero. Accordingly, the zero values add nothing to the sum, which represents the output of the filter. Therefore, it is normally more efficient to effectively insert the zeros by selectively choosing coefficients which are stored, for example, in a coefficient matrix.

In one embodiment, 100 calculations are used during the convolve step of the filter in order to interpolate a new point for each of the 5-point hybrid, the 25-hybrid, and the time-optimal filter. In this embodiment, the 5-point hybrid filter has 500 coefficients and upsamples by a factor of five, the 25-point hybrid filter has 2500 coefficients and upsamples by a factor of 25, and the time-optimal filter has 25,000 points and upsamples by a factor of 250. Since the calculations are normally performed only on the nonzero data points, each filter in this case only requires 100 calculations.

The filter coefficients may depend upon the sample rate. Since a user will normally select a sample rate high enough to satisfy Nyquist limits, the selected sample rate may often be correlated to the primary frequency of the waveform of interest. Alternatively, a user could select individual desired coefficients, or select from filters optimized for each waveform. The filters which operate in embodiments of this invention are optimized with respect to the rising and falling edges of the waveform, since these are the areas of interest which generally define time interval related parameters.

Figure 10A:
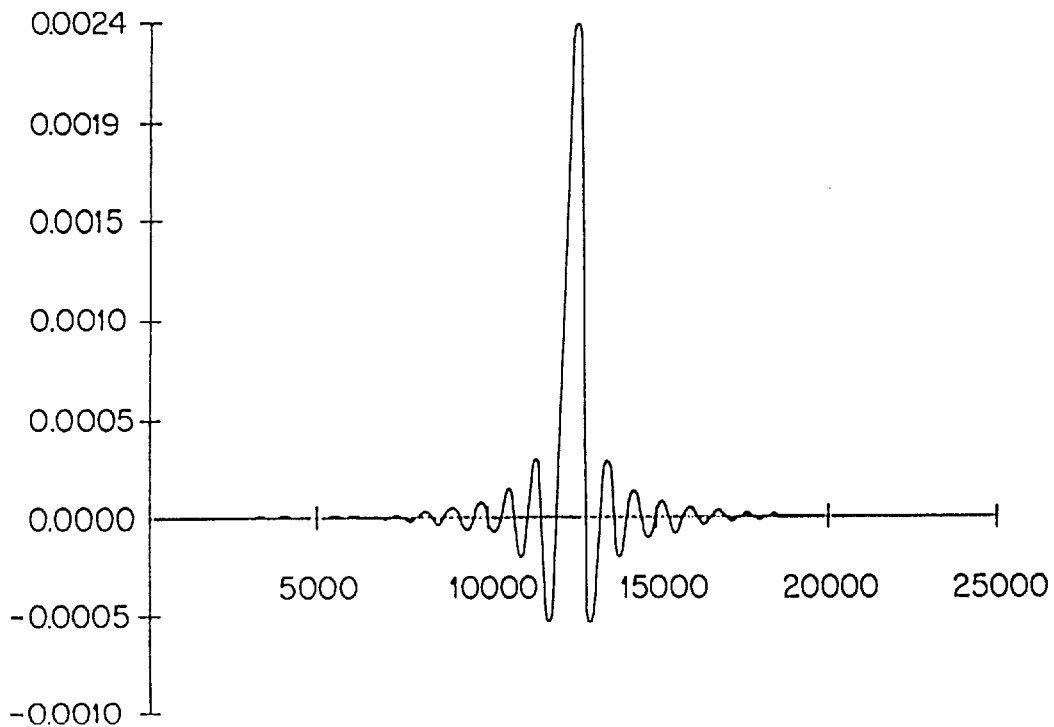
FIG. 10A shows a plot of the filter coefficients for use in one embodiment of the invention.

FIG. 10A shows a plot of the filter coefficients in an embodiment which includes a 25,000 point filter. In this embodiment, the 25,000 point filter is created by upsampling, by a factor of five, a 500 point filter with itself, in order to create a 2500 point filter. Then, the 2500 point filter is upsampled by a factor of ten with a 1000 point filter in order to create the 25,000 point filter.

The 500 point filter has a pass band to 0.25 times the sampling frequency of the input waveform. The sampling frequency is the inverse of the interval between each pair of discrete samples in the series of samples. The stop band of the 500 point filter is 0.35 multiplied by the sampling frequency. Accordingly, the 500 point filter has a transition band of 0.1 multiplied by the sampling frequency.

The 1000 point filter has a pass band to 0.25 multiplied by the sampling frequency, a stop band beginning at 0.40 multiplied by the sampling frequency, and includes a transition band of 0.15 multiplied by the sampling frequency.

Both the 500 point filter and the 1000 point filter have pass band ripple of less than 0.1 dB, and the stop band is located 60 dB down from the pass band.

Accordingly, the number of filter points is determined in step 100, and in step 101 the input series of voltages begins to be convolved, in order to generate a start point. The start point represents the first output of the filter. The input series includes zero values interspersed as described above. In step 102 the process is controlled to analyze the appropriate data points, by incrementing each point to determine a next point, until a sufficient number of points has been convolved. Convolution is preformed in step 103 to generate the next point, and in step 104 it is determined whether the filtered points which result from the convolution surround the threshold. If they do, a binary search is performed in step 105 in order to determine which interpolated points surround the threshold, so that linear interpolation may then be performed between two adjacent interpolated points to determine the threshold crossing. Of course, one of the points that surrounds the threshold may also be an original sample. In step 106 the slope of the points which surround the threshold is calculated. In step 107 the time tag is calculated from the threshold, the interpolated point prior to the threshold, and the slope. These steps may be repeated to determine each time tag at which the voltage is crossed with the selected slope.

Figure 11:
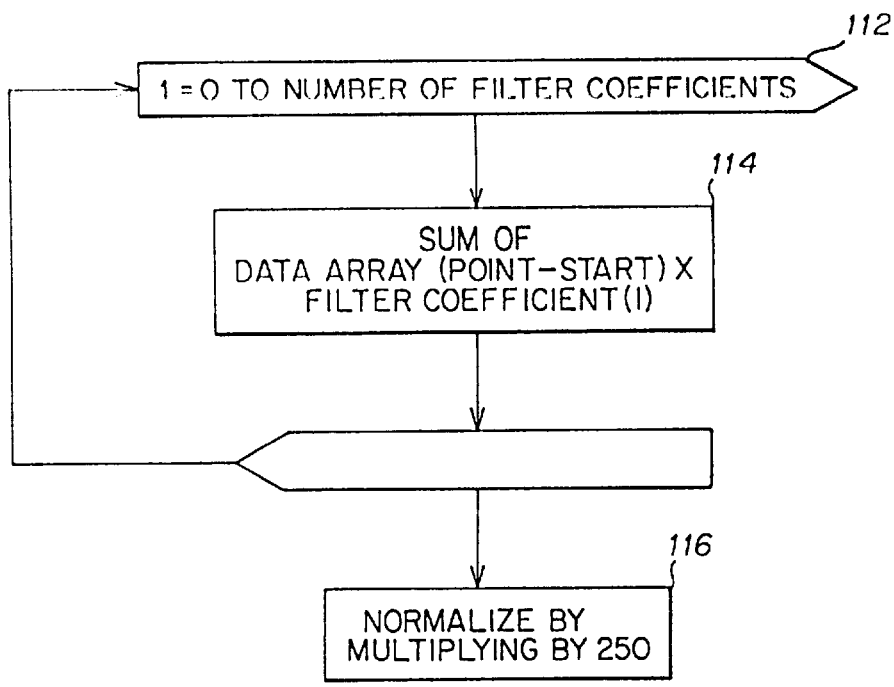

FIG. 11 shows the convolution procedure, for a given array of values positioned at the element called "point". The start has been calculated in step 100 of FIG. 10 as the starting point in the array and may be equal to half the number of filter coefficients. In step 112, the process is controlled to repeat once for each of the filter coefficients. In step 114, each nonzero data point is multiplied by a corresponding filter coefficient, and the resulting products are summed. These results are normalized in step 116 by multiplying by a normalizing factor to generate a convoluted value. In this instance, the normalizing factor has a value of 250.

FIGS. 12–16 illustrate sample displays which may be generated from the display results step 38 of FIG. 3, responsive to the select presentation format step 54 of FIG. 5. Each of these screens may include statistical analysis data, such as minimum value, maximum value, mean value, standard deviation, largest negative phase displacement, largest positive phase displacement, and population size. These statistics are based on the selected event of interest, for example pulse width, period, frequency, or delay. Largest negative phase displacement refers to the greatest amount that the event of interest decreased between adjacent cycles for a particular waveform. For example, if pulse width is the selected event of interest, the pulse width of each cycle is analyzed and compared with the pulse width of the preceding cycle. The greatest negative difference between any adjacent cycles within the record that represents the waveform is the largest negative slope displacement, while the greatest positive difference is the largest positive slope displacement.

Figure 12:
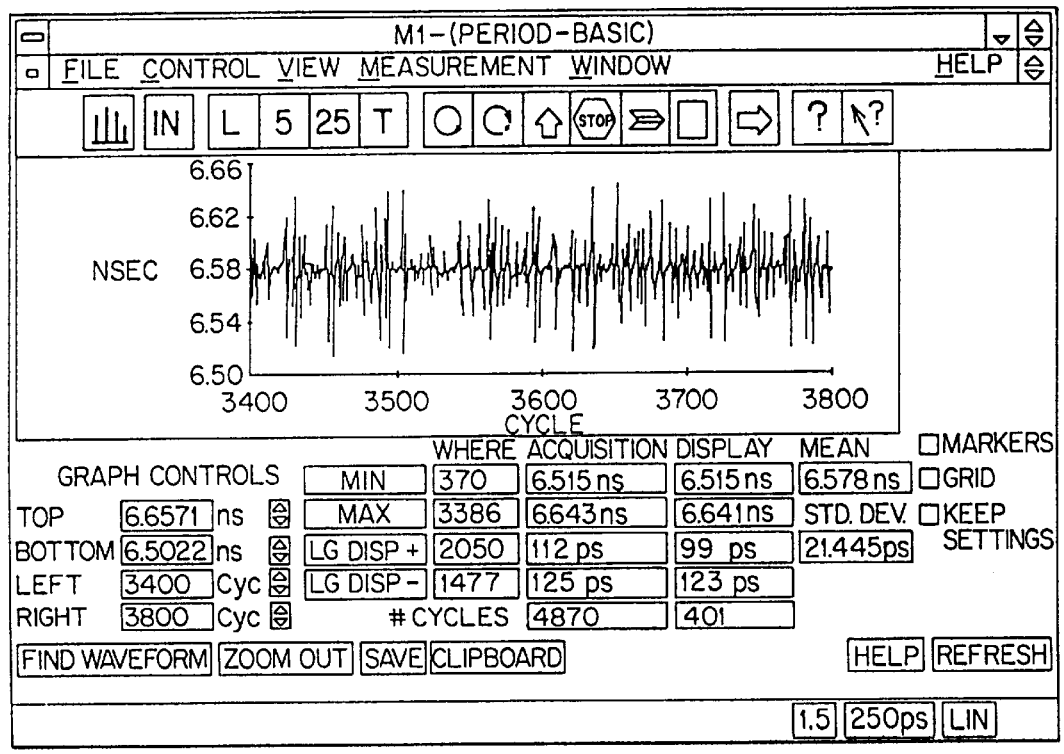
FIGS. 12, 13, 14, 15, 15A, 15B, 16, and 16A show resulting displays according to several embodiments of the invention.

FIG. 12 shows adjacent cycle jitter. This screen contains all of the timing information for every cycle of a waveform record, including arrival-order information. Depending upon the waveform repetition rate, tens of thousands of consecutive cycles will be in a single record and therefore available for display. This cycle-by-cycle display is useful for determining if there is any periodicity to the unintended phase modulation of the waveform, as well as the time behavior of these modulations. In FIG. 12, for example, the x-axis is the cycle number, while the y-axis is the time, in nanoseconds, of the period of each cycle. Additionally, the display shown in FIG. 12 can be modified with respect to a moving window average, as explained below with respect to FIG. 15B.

Figure 13:
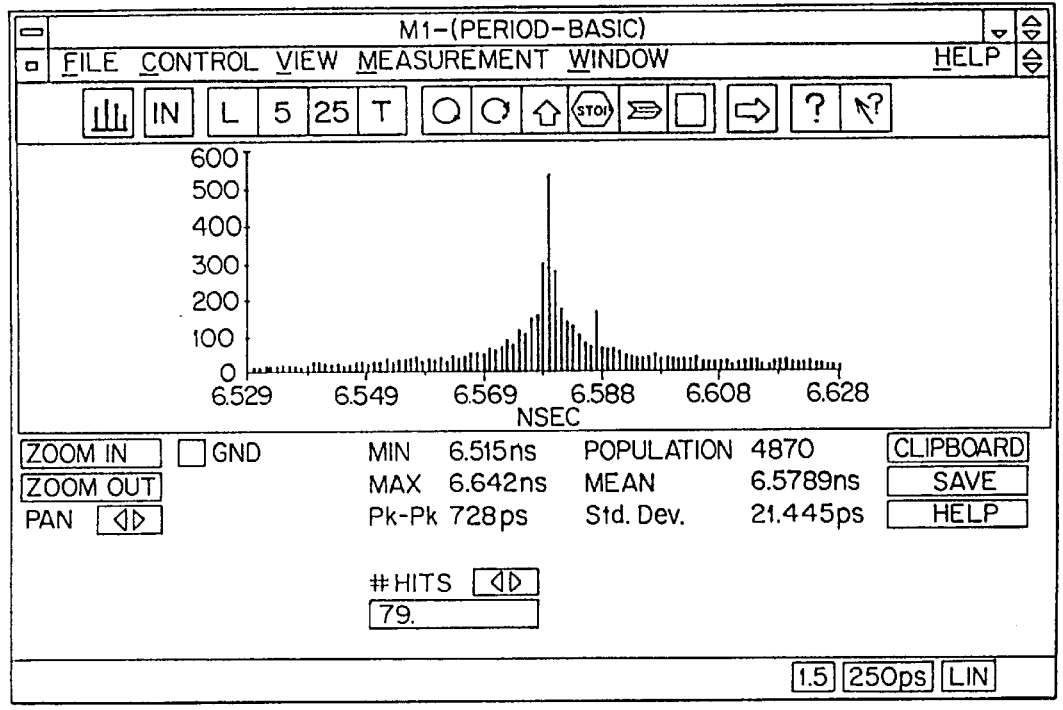

FIG. 13 illustrates a histogram which may be generated from the time tag data. FIG. 13 shows the same data as FIG. 12, but organized to show the relative occurrence of different values of jitter. Although the histogram does not preserve information about the sequencing of the changes in period, it is very useful for determining the overall distribution of jitter displacement.

Figure 14:
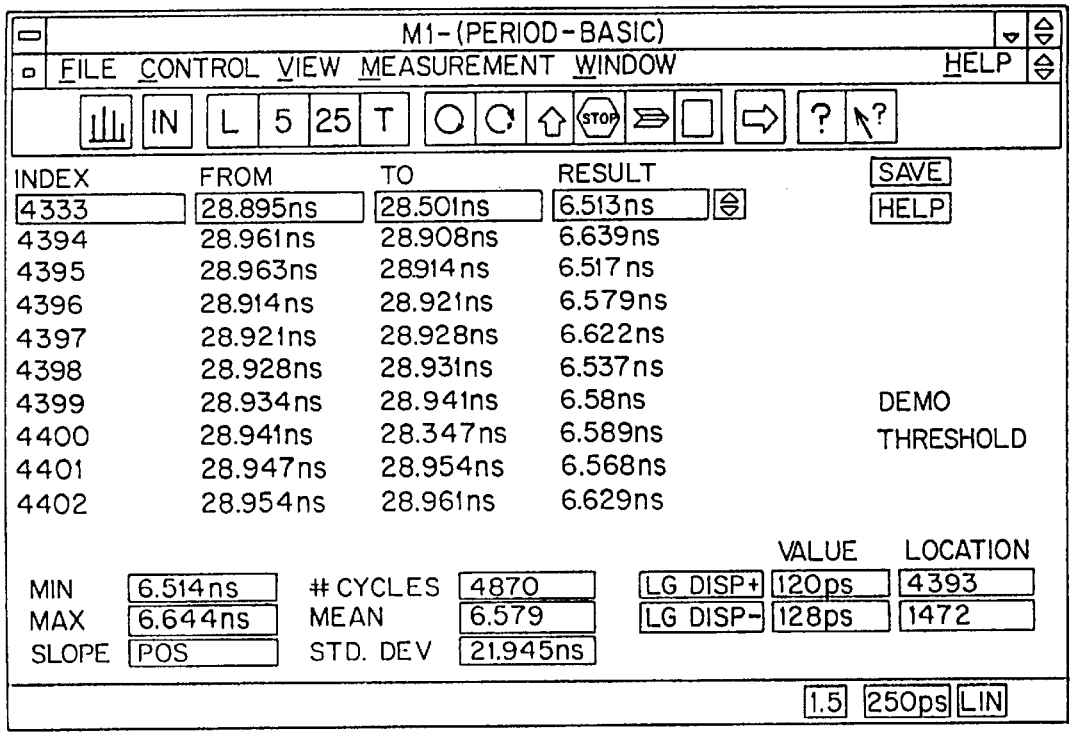

FIG. 14 shows a time-series view in a text format. This allows the values associated with individual events of interest to be viewed. Furthermore, the text data may be imported into a text file or other computer files for use in analysis programs, diagnostic programs, or for spreadsheet analysis. In addition to the text data output which contains the time tag data, additional text data outputs may be generated that contain the results displayed on any of the screens. For example, the text file may contain minimum, maximum, and average values for the parameters of interest.

Figure 15:
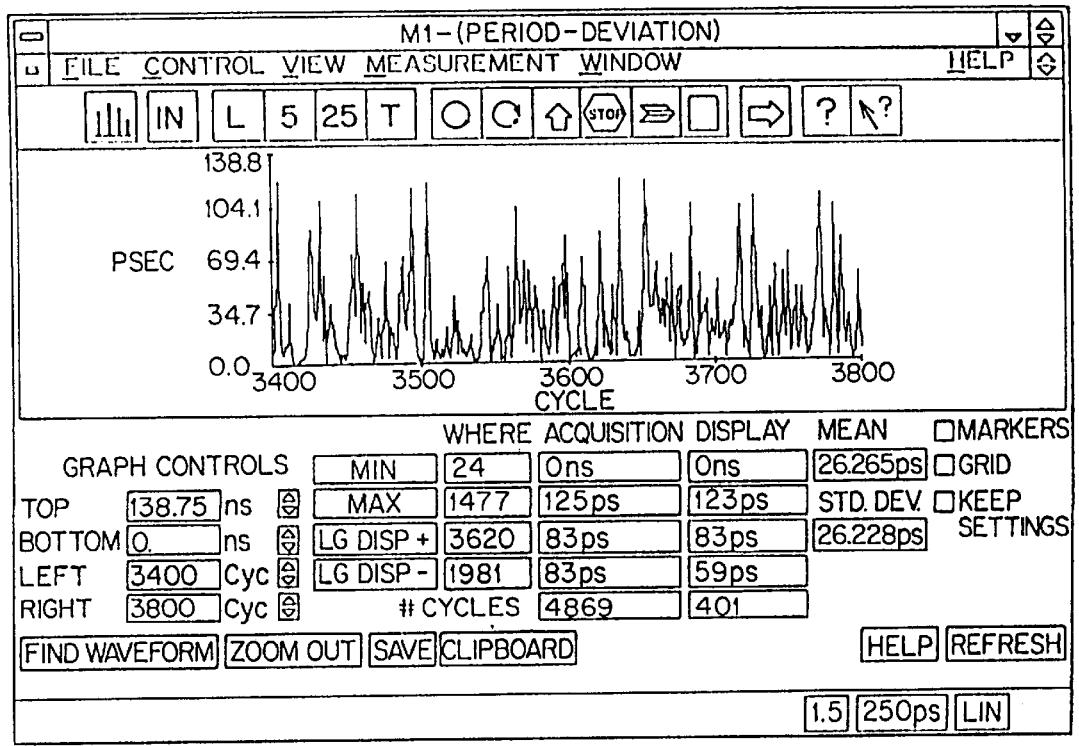

FIG. 15 shows a display for the deviation view, which may be selected in step 56 of FIG. 5. The deviation view illustrates a magnitude of change between adjacent cycles for the event of interest. For example, in the view shown in FIG. 15, the graph represents jitter difference between adjacent cycles. As such, the deviation view may be considered a first derivative of the basic view of FIG. 12.

Figure 15A:
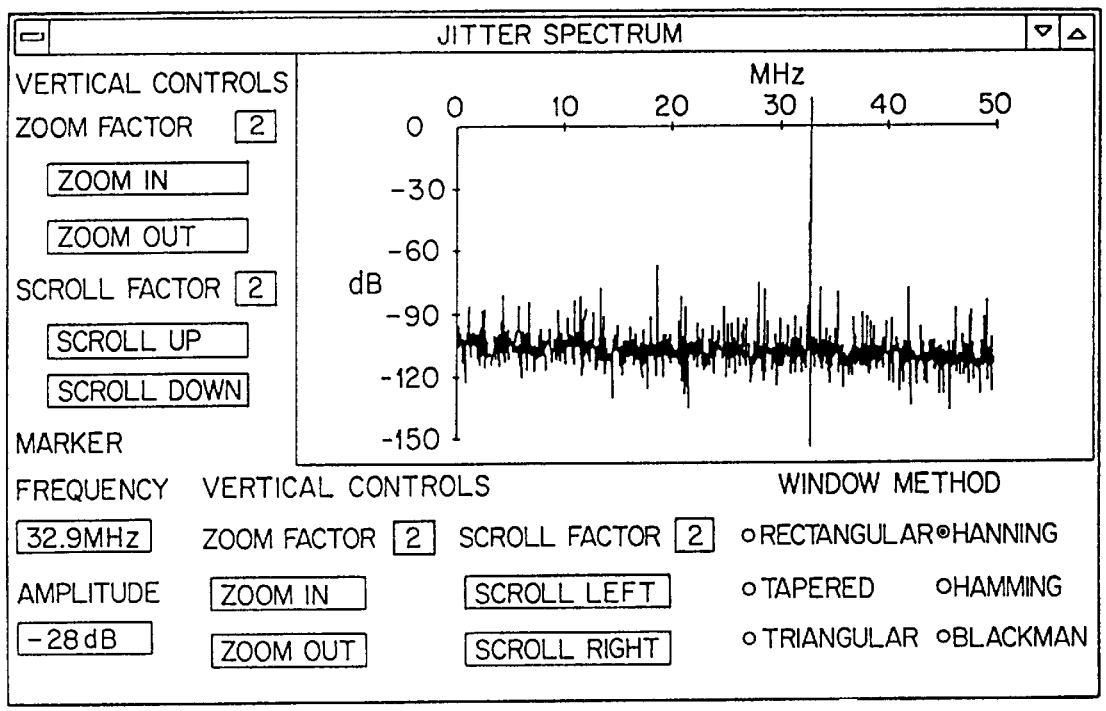

FIG. 15A shows a jitter spectrum view. In the jitter spectrum view, the jitter of the event of interest is plotted in the frequency domain. In this manner, the causes of the jitter may be diagnosed. For example, frequency tones that are relatively low frequency, compared to the signal of interest may be difficult to discern on a normal display. However, when the jitter spectrum is determined and displayed, it may show clear peaks. In the example shown in FIG. 15A, there is a significant peak at 33 MHz, which may be indicative of a 33 MHz clock causing at least one component of the jitter. Alternatively, a peak at a relatively low frequency, such as 30 KHz, may be indicative of a power-supply switching frequency.

Figure 15B:
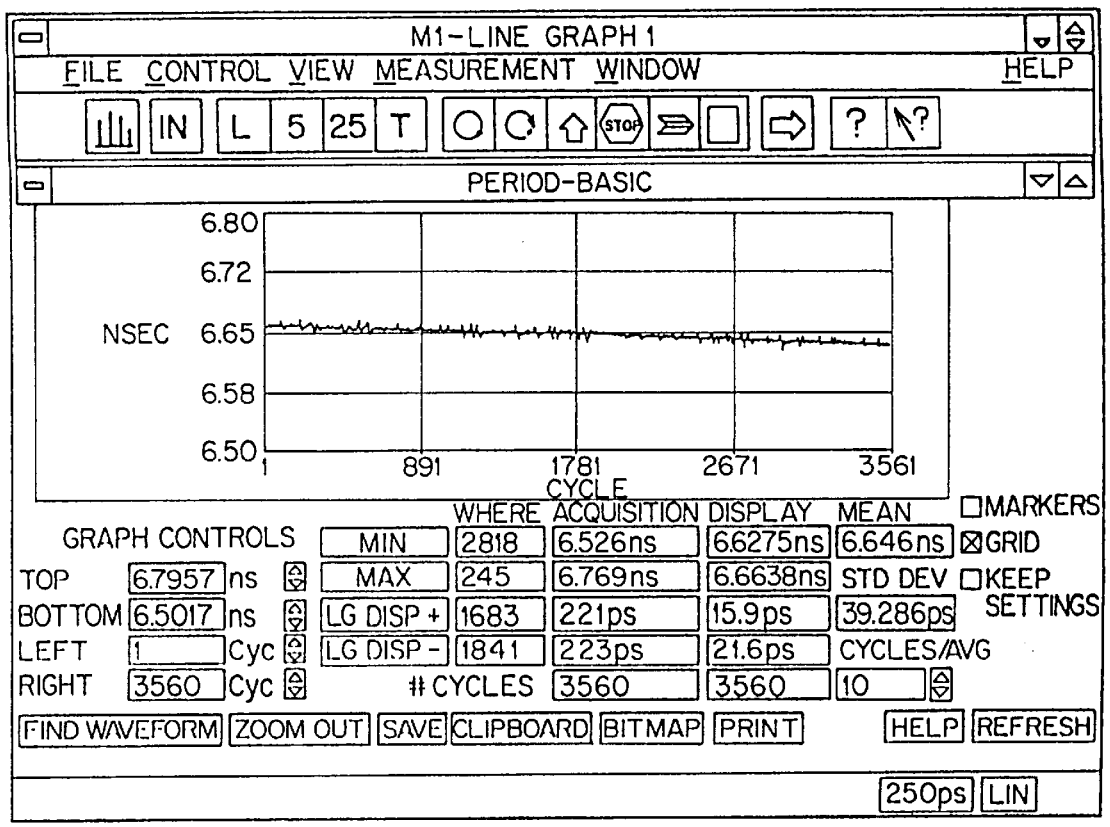

FIG. 15B shows an alternative for diagnosing jitter. In FIG. 15B, a moving average has been selected so that the display shows a ten-cycle average of the period, instead of the actual values of the periods. This may also be called sliding window averaging. In this manner, high frequency modulation is effectively filtered for the display, and a user may be able to view a distinct decreasing trend in the period. Of course, this view may be used for parameters other than period, and any integer may be selected to determine the number of cycles per average.

Figure 16:
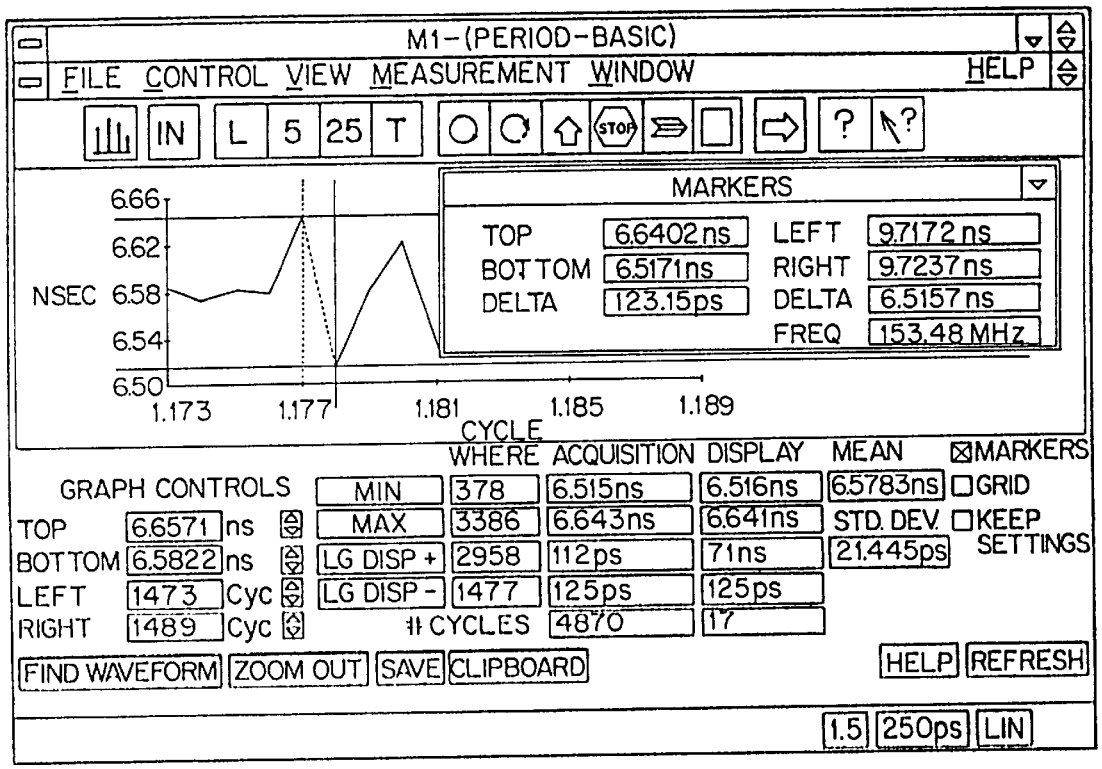

FIG. 16 exemplifies zooming and panning features of the displays. With these features, a user may zoom in, for example, on minimum or maximum period, largest positive or negative jitter displacement, or investigate the general timing characteristics of a region of interest of the overall record. In this display, statistical data for both the entire record as well as the zoomed region may be computed separately. In this manner, a user may view the statistical data of only the zoomed regions, so that it may be compared to the statistical data of the entire record. This may be very useful, for example, if a user were zooming in on a particular region because the region contained a maximum value. By viewing the statistical data of the zoomed region, the user may be able to determine that other statistical parameters correlate within the zoomed region, and may thus arrive at diagnostic conclusions. Markers are available on all displays in order to assist a user in analysis. By using either the zoom feature shown in FIG. 16, or the text output shown in FIG. 14, a user may actually view adjacent cycle parameters for analysis.

Figure 16A:
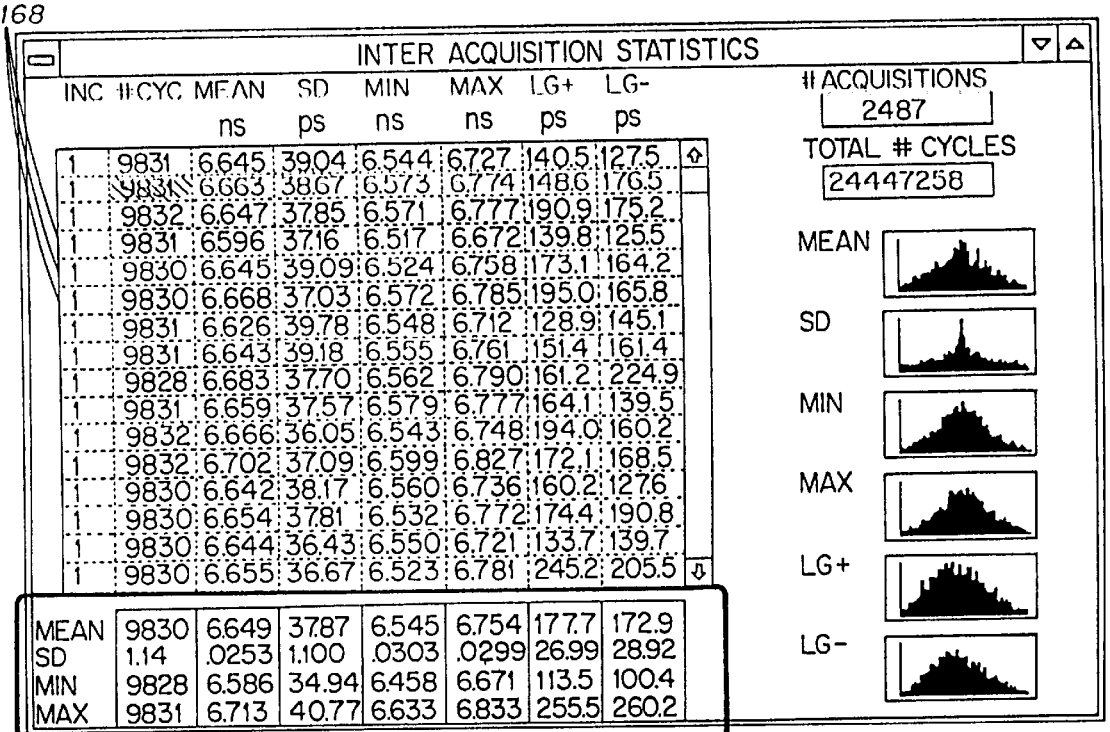

FIG. 16A shows a display used for inter-acquisition statistics. In FIG. 16A, as explained in connection with FIG. 3A, the results from several individual acquisitions 168 are displayed. Additionally, the display includes a summary 169 which contains statistics of the statistics. For example, the display may calculate the standard deviation of the standard deviation across several records, in order that a user may gain further insight into the waveform or waveforms of interest.

Figure 17:
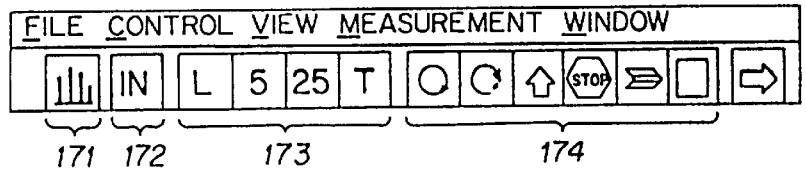
FIGS. 17, 18, and 19 show displays which may be used for steps shown in FIG. 3.
Figure 18:
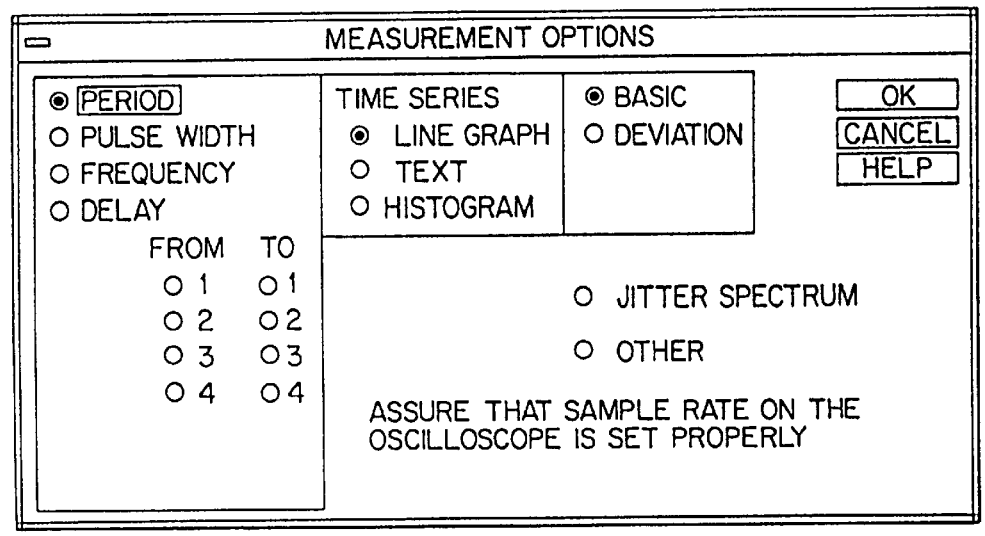
Figure 19:
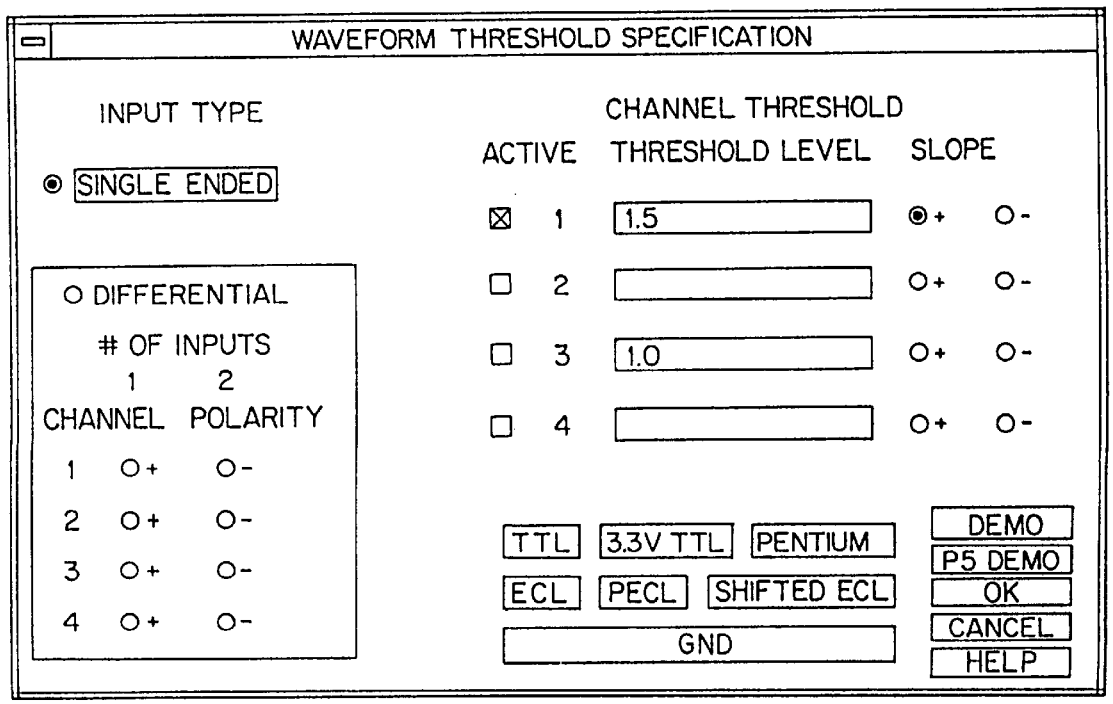
Figure 20:
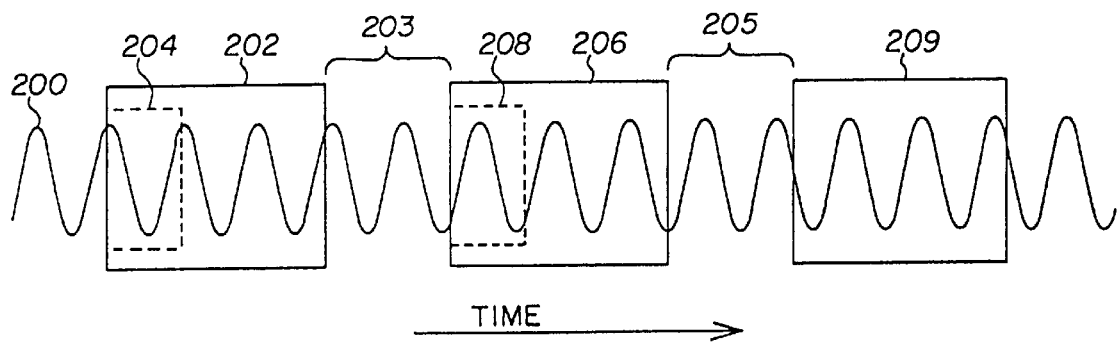
FIG. 20 shows a waveform, and illustrates data capture using an oscilloscope.
Figure 21:
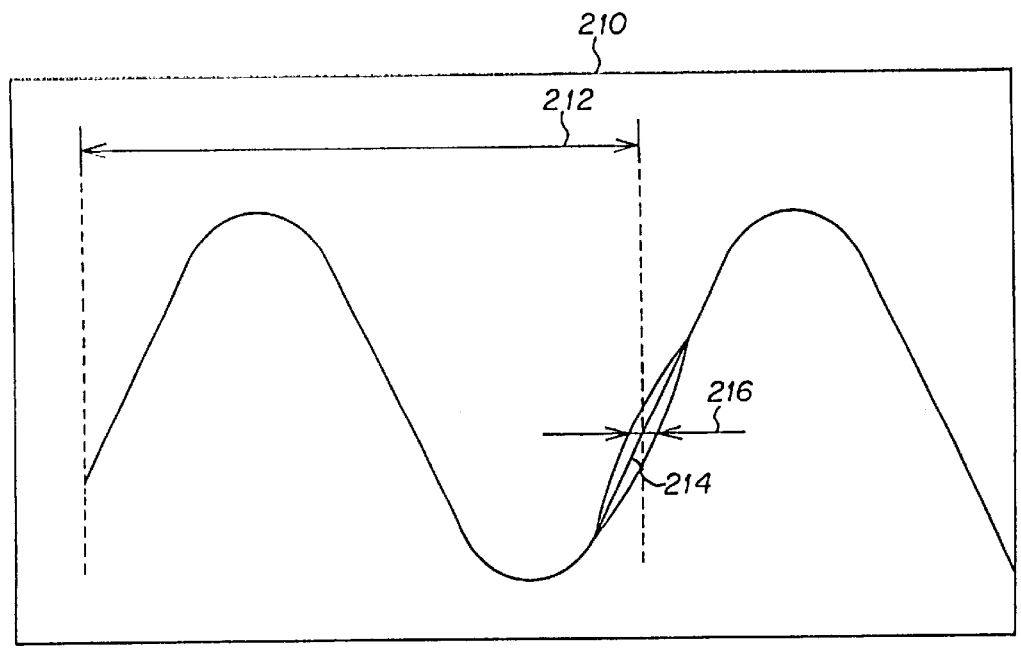
FIG. 21 shows a display of a waveform.

FIG. 17 shows a display for performing the steps associated with step 30 of FIG. 3, set up analysis system. FIG. 17 shows buttons which may be implemented as hardware switches, or as menu selections in a display window in a mouse-driven system such as a window-based software environment. Button 171 is used to activate a display for selecting a measurement, which is shown in FIG. 18. Button 172 is used to activate a display for specifying a threshold, which is shown in FIG. 19. Buttons 173 are used to select among a number of interpolation filters. Choices which are nominally available include a linear filter, a 5-hybrid filter, a 25-hybrid filter, and a time-optimal filter as discussed above. Buttons 174 are for functions such as initiating the measurement manually, initiating the measurement to occur repetitively, stopping measurement system, and generating outputs and performing other administrative functions. Through these buttons, for example, a scope may be controlled to acquire a number of points upon meeting a threshold condition, and the system will perform the selected analysis on this number of points and display the resulting analysis. Alternatively, the scope may acquire a continuous stream of data points, and the system may then continuously perform the selected analysis and continuously update the display such as the histogram FIG. 18 shows a display for selecting measurement options, as described with respect to FIG. 5. FIG. 19 shows a display for specifying threshold, as described with respect to FIG. 6.

Figure 22:
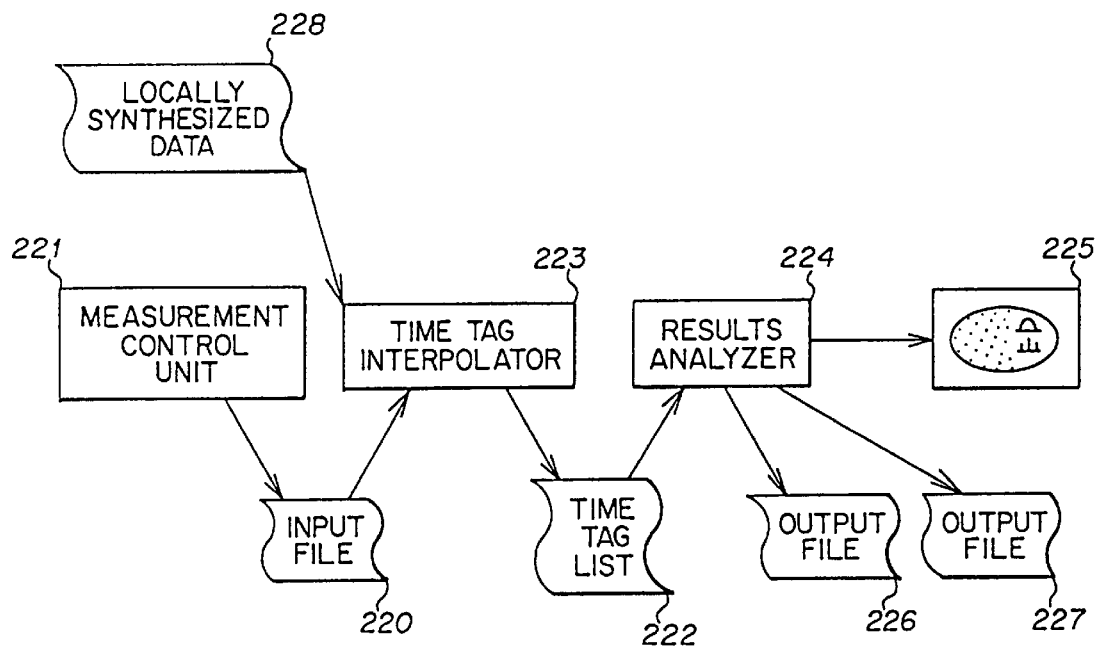
FIG. 22 illustrates an apparatus embodiment of the invention.

FIG. 22 illustrates an embodiment in which interim files are used to generate the outputs, and also represents an apparatus embodiment. For example, input file 220 has been generated from measurement system 4 as a result of commands from measurement control unit 221. The time tag interpolator 223 interpolates the voltage sequence within the input file 220 in order to generate a time tag list 222. The time tag list may be used by the results analyzer 224 in order to create the display windows 225, or output files 226, 227. Output file 226 may contain the textual versions of the results of the analysis. Output file 227 may be, for example, a graphics file that may be used to recreate the displays. In one embodiment that uses a Pentium-based computer with a WINDOWS operating environment, the output file 227 is a bitmapped file created by a clipboard function of the operating environment. However, any method of creating an output file may be used. Accordingly, the output file 227 may be displayed, or inserted in other files for further analysis. For example, in the DOS operating system, a .TXT extension in a file name is indicative of a file which adheres to a text standard, and a TIF extension in a file name is indicative of a file which adheres to a graphics standard. In an environment that uses the DOS operating system, output file 226 may be a .TXT file while output file 227 is a TIF file. The time tag interpolator 223 as well as the results analyzer 224 may be implemented as circuits, as software residing in the memory of a general purpose computer, or as a combination of circuits and software. FIG. 22 also shows locally synthesized data 228, which is used to validate the applicability of the selected parameters, as explained with respect to FIG. 3A.

Figure 23:
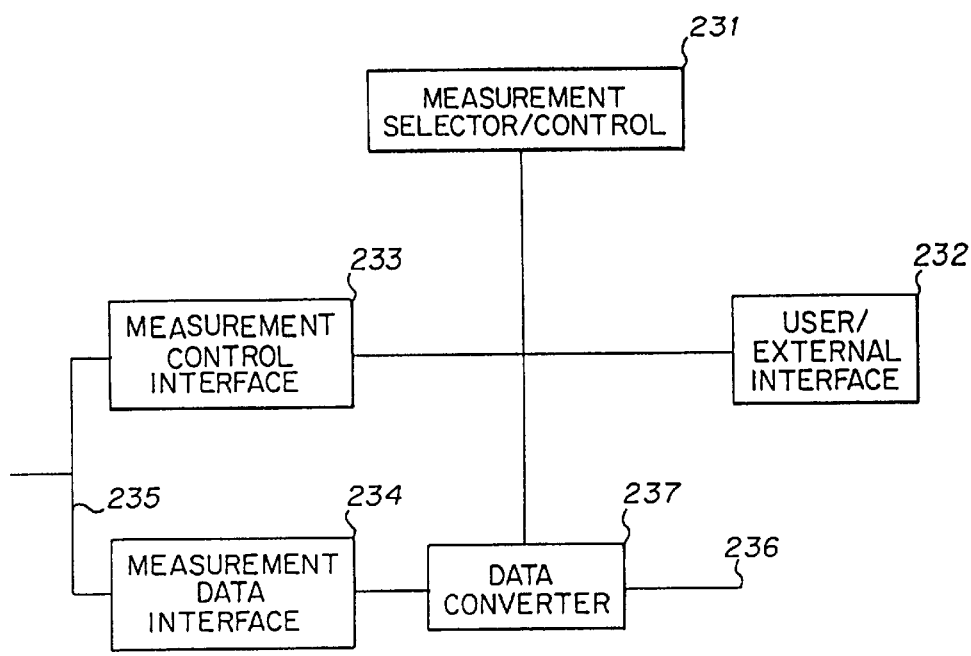
FIG. 23 shows a block diagram for a measurement control unit.

FIG. 23 shows a block diagram of a measurement control unit 221. Although it may be implemented in software, this block diagram is exemplary of a hardware implementation. The measurement control unit 221 may include a measurement selector/control unit 231 which provides overall control. Additionally, the measurement selector/control unit 221 stores the specifics of the measurements selected, such as a threshold voltage. The measurement control unit 221 receives input commands via a user/external interface 232. A measurement control interface 233 provides control for the measurement system 4, via a data interface 235. Also received across the data interface 235 is the raw data from the measurement system 4. This raw data may be in any form. A measurement data interface 234 provides the raw data to a data converter 237, which in turn provides the input file 220 via an output 236.

Figure 24:
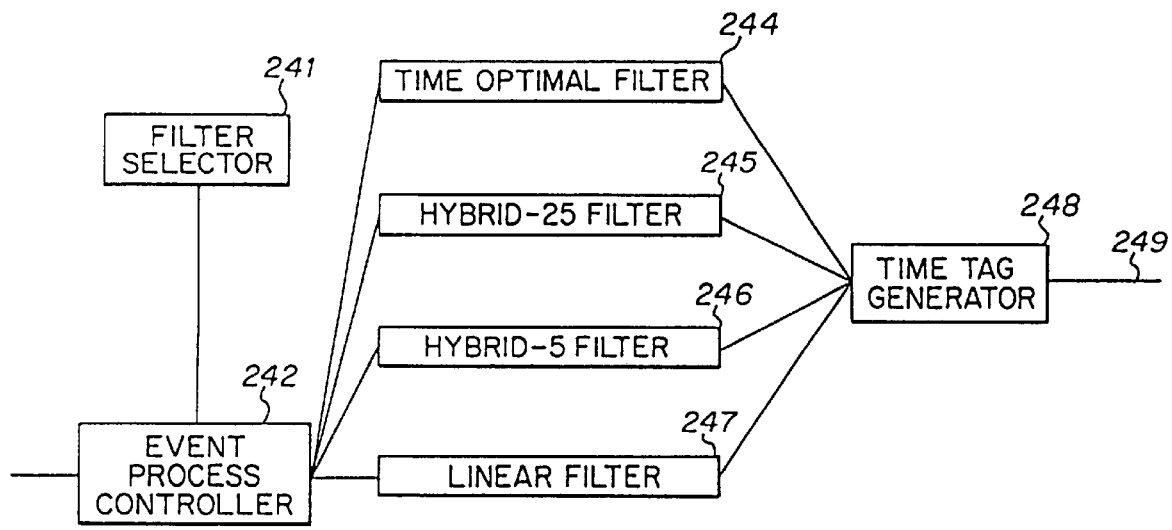
FIG. 24 shows a block diagram for a time tag interpolator.

FIG. 24 shows a block diagram of a time tag interpolator 223. The time tag interpolator 223 includes a filter selector 241, and an event process controller 242. The filter selector 241 selects among filters for interpolating, such as a time optimal filter 244, a hybrid-25 filter 245, a hybrid-5 filter 246, and a linear filter 247. Additional filters may also be implemented within the time tag interpolator. The event process controller 242 receives data from input file 220, and controls the appropriate filter or combination of filters to process the data in accordance with the event of interest. For example, if the event of interest is a threshold, then the event process controller controls the appropriate filter to interpolate with respect to the threshold. A time tag generator 248 receives outputs from the filters and generates the time tag list 222 from output 249.

Figure 25:
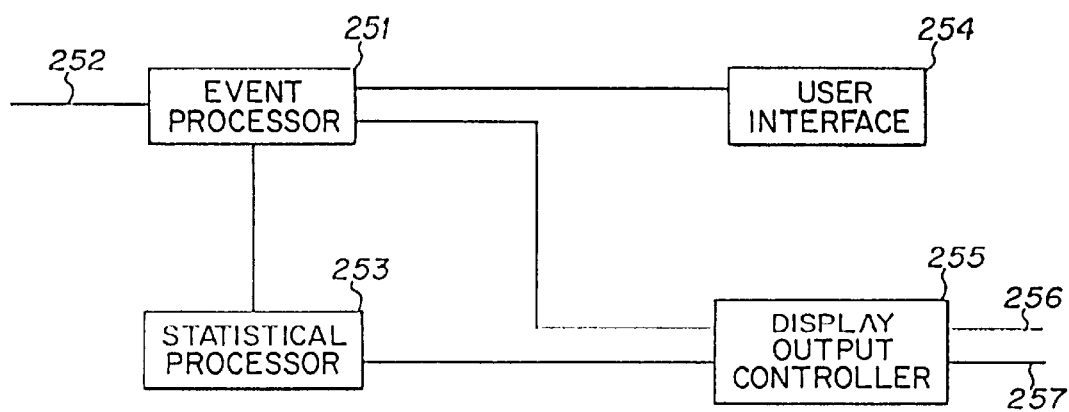
FIG. 25 shows a block diagram for a results analyzer.

FIG. 25 shows a block diagram for a results analyzer 224. An event processor 251 receives the time tag list 222 via input 252. The event processor 251 analyzes the time tag list in accordance data received from user interface 254, which receives commands from a user or external interface regarding display selection, etc. A statistical processor 253 provides statistical data such as mean, standard deviation, etc. A display/output controller 255 controls a display via first output 256, and may provide output files 226, 227 via second output 257.

Table 1 shows an example of a file generated from a text view. The acquisition data includes such information as threshold, selected filter, and statistical data, followed by time tags of individual results.

TABLE 1

| Acquisition Data |
| --- |
| Threshold 1.0 |
| Scope Resolution 250 ps |
| Filter LIN |
| Measurement Type Pulse Width - Basic |
| Slope Negative |
| Number of cycles 894 |
| Minimum Value 4.17 ns |
| Maximum Value 51.593 ns |
| Mean Value 14.871 ns |
| Standard Deviation 12.715 ns |
| Largest Positive Displacement 44.433 ns |
| Location 886 |
| Largest Negative Displacement 44.792 ns |
| Location 887 |

TABLE 1-continued

| Time Tag | Result |
| --- | --- |
| 0 | |
| 1.777155075e−008 | 5.018e−009 |
| 3.776980428e−008 | 1.1553e−008 |
| 6.184929037e−008 | 3.5335e−008 |
| 1.023602928e−007 | 1.0262e−008 |
| 1.192196405e−007 | 4.427e−009 |
| 1.370735534e−007 | 7.52e−009 |
| 1.593523688e−007 | 5.1953e−008 |
| 2.208885971e−007 | 7.161e−009 |
| 2.380314614e−007 | 4.592e−009 |
| 2.574774215e−007 | 1.0683e−0Q8 |
| 2.813039791e−007 | 3.5321e−008 |
| 3.227623283e−007 | 1.1113e−008 |
| 3.395404002e−007 | 4.788e−009 |
| 3.571734497e−007 | 6.811e−009 |
| 3.789129594e−007 | 1.478e−008 |
| 4.040659724e−007 | 3.603e−008 |
| 4.412413692e−007 | 7.89e−009 |
| 40583096699e−007 | 4.304e−009 |
| 4.772528012e−007 | 9.848e−009 |

Table 2 shows an example of a file generated from a line graph view, and includes acquisition data similar to that shown in Table 1, as well as window data describing the data corresponding to the display window, as well as the results corresponding to the line graph.

TABLE 2

| Acquisition Data |
| --- |
| Threshold 1.0 |
| Scope Resolution 250 ps |
| Filter LIN |
| Measurement Type Period - Basic |
| Slope Negative |
| Number of Cycles 895 |
| Minimum Value 15.925 ns |
| Maximum Value 61.934 ns |
| Mean Value 25.003 ns |
| Standard Deviation 10.944 ns |
| Largest Positive Displacement 44.83 ns |
| Largest Negative Displacement 39.919 ns |
| In Window |
| |
| Number of Cycles 895 |
| Minimum Value 15.925 ns |
| Maximum Value 61.934 ns |
| Largest Positive Displacement 44.83 ns |
| Largest Negative Displacement 39.919 ns |
| Result |
| |
| 2.1454e−008 |
| 1.7545e−008 |
| 1.6729e−008 |
| 4.1932e−008 |
| 2.3689e−008 |
| 1.9186e−008 |
| 1.7104e−008 |
| 6.1934e−008 |
| 2.2015e−008 |
| 1.7736e−008 |
| 1.682e−008 |
| 4.0986e−008 |
| 2.3958e−008 |
| 1.9717e−008 |
| 1.7184e−008 |

Table 3 shows an example of a file generated from a histogram view. As can be seen, Table 3 also contains acquisition data such as the selected threshold, selected interpolation filter, and statistical data. Additionally, Table 3 also includes actual result data in a list format corresponding to a histogram display.

TABLE 3

Acquisition Data

Threshold 1.0
Scope Resolution 250 ps
Filter LIN
Measurement Type Frequency - Basic
Slope Negative
Number of Cycles 895
Minimum Value 16.146 MHz
Maximum Value 62.794 MHz
Mean Value 45.706 MHz
Standard Deviation 13.727 MHz N
Peak to Peak 46.648 MHz

| Bar Start | Number of Cycles |
|---|---|
| 20.00259393 | 0. |
| 20.51572411 | 0. |
| 21.02885439 | 0. |
| 21.54198457 | 0. |
| 22.05511475 | 22. |
| 22.56824493 | 22. |
| 23.08137321 | 22. |
| 23.5945034 | 23. |
| 24.10763168 | 23. |
| 24.62076187 | 22. |
| 25.13389206 | 22. |
| 25.64702034 | 0. |
| 26.16015053 | 22. |

Table 4 shows an example of a file representative of an input to measurement control unit 221. The file includes a header with descriptive information entered by a user, threshold information, scope preamble information, and a list of raw data points. The list of raw data points in this example corresponds to a screen position value of a digital oscilloscope. In order to create an input file 220 that includes a series of discrete voltages, the screen position value may be transformed into a corresponding discrete voltage.

TABLE 4

Preamble 0.
0.
89599.
0.
2.5e−010
0.
0.
0.
0.
0.

Length

89599

Data 0.
0.4629789588
0.9235251591
1.379220757
1.827677644
2.266552091
2.693559109
3.106486455
3.503208186
3.881697684
4.240040066
4.576443905
4.889252195
5.17695248
5.438186094
5.671756462

TABLE 4-continued 5.876636386
6.051974303
6.197099446
6.311525904
6.39495553
6.447279703
6.468579914
6.459127182
6.419380304

Also included in the file shown in Table 4 may be the sampling frequency and start time, so that the relative and actual time of each corresponding discrete voltage may be generated.

In accordance with this invention, a very accurate time tag list may be generated which corresponds to occurrences of an event of interest of a waveform. By generating the time tag list through linear interpolation or by a combination of upsampling and linear interpolation, the trigger interpolation error of time interval measurement may be significantly reduced. Furthermore, information relating to adjacent cycles of a waveform of interest can be interpreted accurately. Also, relative zero crossings between two differential signals can be determined.

Several implementations of the invention are envisioned, including one in which the invention includes a personal computer connected to an oscilloscope. Further implementations include software structure residing on a general purpose computer, a standalone personal computer that receives computer files and provides off-line analysis, or special purpose hardware dedicated to performing the functions described.

Having thus described several particular embodiments of the invention, various alterations, modifications, and improvements will readily occur to those skilled in the art. For example, the invention may use a general purpose computer other than any disclosed, and may be implemented with other measurement systems. Additionally, further improvements may be made to the disclosed filters, in order to provide more accurate representations of the waveform, or to achieve desired results in less time or with less computing resources. Also, the embodiments of the invention discussed above are related to electrical voltage measurements. This invention is also applicable to current measurements and other types of signal waveforms. Such alterations, modifications, and improvements are intended to be within the spirit and scope of the invention. Accordingly, the foregoing description is by way of example only, and not intended to be limiting. The invention is limited only as defined in the following claims and the equivalents thereto.

What is claimed is:

1. An apparatus for interpolating a discrete time series that represents voltages of a waveform, to determine a point at which the waveform crosses a threshold voltage, the apparatus comprising:

means for upsampling the discrete time series to create an upsampled discrete time series;

means, coupled to the means for upsampling, for determining a first digital word and a second digital word of the upsampled series of digital words that surround the threshold voltage; and means, coupled to the means for determining, for performing linear interpolation between the first digital word and the second digital word to determine a time tag corresponding to the point at which the waveform crosses the threshold voltage;

wherein the means for low-pass filtering includes:
  a low-pass filter that has a plurality of coefficients;
  means for inserting a digital word with a zero value between each adjacent pair of digital words in the series of digital words, to create a zero-valued series of digital words; and
  means for low-pass filtering the zero-valued series of digital words with the low-pass filter, to create the upsampled series of digital words.

2. The apparatus of claim 1, wherein the waveform is sampled at a sampling frequency to generate the series of digital words, and wherein the low-pass filter includes:
  a 500 point low-pass filter having a pass band to 0.25 multiplied by the sampling frequency and a stop band beginning at 0.35 multiplied by the sampling frequency;
  means for upsampling the 500 point low-pass filter with respect to itself to generate a 2500 point low-pass filter;
  a 1000 point low-pass filter having a pass band to 0.25 multiplied by the sampling frequency and a stop band beginning at 0.4 multiplied by the sampling frequency; and
  means for upsampling the 2500 point filter with respect to a 1000 point filter to create a 25000 point filter.

3. A method for analyzing time interval data of a waveform, comprising the steps of:
  converting the waveform into a series of digital words, each word of the series of digital words representing a voltage of the waveform and a sample time at which the voltage occurred;
  selecting an event of interest defined by a characteristic of the waveform; and
  interpolating the series of digital words to generate a time tag list, the time tag list including a series of time tags, each of the series of time tags representing a time at which the event of interest occurred during the waveform;
  wherein the step of selecting an event of interest includes the steps of:
    selecting measurement parameters;
    specifying threshold information; and
    selecting an interpolation filter that is used in the step of interpolating; and
  wherein the step of selecting measurement parameters includes the steps of:
    selecting an input type to be one of differential measurement and single ended measurement;
    selecting at least one channel; and
    selecting at least one slope, corresponding to each at least one channel, to be one of a positive polarity and a negative polarity;
  and wherein the step of specifying threshold information includes one of;
    specifying a threshold voltage;
    selecting a predetermined voltage to be one of a standard TTL voltage, a 3.3 Volt TTL voltage, a standard ECL voltage, a positive ECL voltage, a shifted ECL voltage, and a ground voltage; and
    selecting multiple threshold voltages of 0.8 volts, 1.5 volts, and 2.0 volts, each of which represents an event of interest.

4. A method for analyzing time interval data of a waveform, comprising the steps of:
  converting the waveform into a series of digital words, each word of the series of digital words representing a voltage of the waveform and a sample time at which the voltage occurred;
  selecting an event of interest defined by a characteristic of the waveform; and
  interpolating the series of digital words to generate a time tag list, the time tag list including a series of time tags, each of the series of time tags representing a time at which the event of interest occurred during the waveform;
  wherein the step of selecting an event of interest includes the steps of:
    selecting measurement parameters;
    specifying threshold information; and
    selecting an interpolation filter that is used in the step of interpolating; and
  wherein the step of selecting measurement parameters includes the steps of:
    selecting a parameter to be analyzed to be one of period, pulse width, frequency, and delay;
    selecting a presentation format to be one of time series line graph, time series text, histogram, and jitter spectrum; and
    selecting an analysis type to be one of basic and deviation.

5. An apparatus for interpolating a discrete time series that represents voltages of a waveform, to determine a point at which the waveform crosses a threshold voltage, the apparatus comprising:
  means for upsampling the discrete time series to create an upsampled discrete time series;
  means, coupled to the means for upsampling, for determining a first digital word and a second digital word of the upsampled series of digital words that surround the threshold voltage; and
  means, coupled to the means for determining, for performing linear interpolation between the first digital word and the second digital word to determine a time tag corresponding to the point at which the waveform crosses the threshold voltage;
  wherein the waveform includes a plurality of cycles, each of the plurality of cycles having a rising edge and a falling edge, and wherein the means for upsampling includes:
    a filter having characteristics that are optimized to accurately recreate the waveform at each rising edge and each falling edge;
    means for inserting a digital word with a zero value between each adjacent pair of digital words in the series of digital words, to create a zero-valued series of digital words; and
    means for filtering the zero-valued series of digital words according to the filter to create the upsampled series of digital words.

6. A method for analyzing time interval data of a waveform, comprising the steps of:
  converting the waveform into a series of digital words, each word of the series of digital words representing a voltage of the waveform and a sample time at which the voltage occurred;
  selecting an event of interest defined by a characteristic of the waveform; and
  interpolating the series of digital words to generate a time tag list, the time tag list including a series of time tags, each of the series of time tags representing a time at which the event of interest occurred during the waveform;

wherein the step of interpolating includes interpolating according to one of:
a linear interpolation filter; and
a time optimal interpolation filter that is a combination of a non-linear interpolation filter and the linear interpolation filter;
wherein the step of interpolating includes interpolating according to one of:
a linear interpolation filter; and
a time optimal interpolation filter that is a combination of a non-linear interpolation filter and the linear interpolation filter;
wherein the step of selecting an event of interest includes selecting a threshold voltage, wherein the series of digital words correspond to a sampling frequency, and wherein the step of interpolating according to a linear interpolation filter further includes the steps of:
determining a first digital word and a second digital word that surround the threshold voltage;
determining a first difference between the first digital word and the second digital word;
determining a second difference between the first digital word and the threshold;
determining a relative time to be the second difference divided by a multiplication product of the first difference and the sampling frequency; and
determining one of the series of time tags to be equal to a sum of the sample time of the first digital word and the relative time.

7. A method for analyzing time interval data of a waveform, comprising the steps of:
converting the waveform into a series of digital words, each word of the series of digital words representing a voltage of the waveform and a sample time at which the voltage occurred;
selecting an event of interest defined by a characteristic of the waveform; and
interpolating the series of digital words to generate a time tag list, the time tag list including a series of time tags, each of the series of time tags representing a time at which the event of interest occurred during the waveform;
wherein the step of interpolating includes interpolating according to one of:
a linear interpolation filter; and
a time optimal interpolation filter that is a combination of a non-linear interpolation filter and the linear interpolation filter;
wherein the step of selecting an event of interest includes selecting a differential measurement, wherein the step of converting includes steps of converting a first waveform into a first series of digital words and converting a second waveform into a second series of digital words, each of the first series of digital words corresponding to one of the second series of digital words, wherein the first and second series of digital words correspond to a sampling frequency, and wherein the step of interpolating according to a linear interpolation filter includes the steps of:
determining a difference between each digital word of the first series and the corresponding digital word of the second series, to generate a series of differences;
determining a first difference and a second difference that surround a value of zero;
determining a third difference between the first difference and the second difference;
determining a relative time to be the first difference divided by a multiplication product of the third difference and the sampling frequency; and
determining the time tag to be equal to a sum the sample time at which the digital words that correspond to the first difference were sampled and the relative time.

8. A method for analyzing time interval data of a waveform, comprising the steps of:
converting the waveform into a series of digital words, each word of the series of digital words representing a voltage of the waveform and a sample time at which the voltage occurred;
selecting an event of interest defined by a characteristic of the waveform; and
interpolating the series of digital words to generate a time tag list, the time tag list including a series of time tags, each of the series of time tags representing a time at which the event of interest occurred during the waveform;
wherein the step of interpolating includes interpolating according to one of:
a linear interpolation filter; and
a time optimal interpolation filter that is a combination of a non-linear interpolation filter and the linear interpolation filter;
wherein the step of interpolating according to a time optimal interpolation filter includes the steps of:
upsampling the series of digital words to create an upsampled series of digital words;
determining a first digital word and a second digital word of the upsampled series of digital words that surround the threshold voltage; and
performing linear interpolation between the first digital word and the second digital word to determine a time tag corresponding to the event of interest.

9. The method of claim 8, wherein the waveform includes a plurality of cycles, each of the plurality of cycles having a rising edge and a falling edge, and wherein the step of upsampling includes the steps of:
providing a filter having characteristics that are optimized to accurately recreate the waveform at each rising edge and each falling edge; and
inserting a digital word with a zero value between each adjacent pair of digital words in the series of digital words, to create a zero-valued series of digital words; and
filtering the zero-valued series of digital words according to the filter, to create the upsampled series of digital words.

10. The method of claim 8, wherein the step of upsampling includes the steps of:
providing a low-pass filter that has a plurality of coefficients;
inserting a digital word with a zero value between each adjacent pair of digital words in the series of digital words, to create a zero-valued series of digital words; and
low-pass filtering the zero-valued series of digital words with the low-pass filter, to create the upsampled series of digital words.

11. The method of claim 10, wherein the waveform is sampled at a sampling frequency to generate the series of digital words, and wherein the step of providing a low-pass filter includes the steps of:

providing a 500 point low-pass filter having a pass band to 0.25 multiplied by the sampling frequency and a stop band beginning at 0.35 multiplied by the sampling frequency;

upsampling the 500 point low-pass filter with respect to itself to generate a 2500 point low-pass filter;

providing a 1000 point low-pass filter having a pass band to 0.25 multiplied by the sampling frequency and a stop band beginning at 0.4 multiplied by the sampling frequency; and upsampling the 2500 point filter with respect to a 1000 point filter to create a 25000 point filter that is the low-pass filter provided in the step of providing a low-pass filter.

12. The method of claim 10, further including the steps of:

determining statistical properties of the time tag list; and displaying the time tag list and the statistical properties of the time tag list in one of a basic mode and a deviation mode as one of a line graph, text, a histogram, and a jitter spectrum;

and wherein the step of selecting an event of interest includes steps of:

selecting a parameter to be analyzed to be one of period, pulse width, frequency, and delay; and wherein the step of selecting an event of interest further includes one of;

specifying a threshold voltage;

selecting a predetermined voltage to be one of a standard TTL voltage, a 3.3 Volt TTL voltage, a standard ECL voltage, a positive ECL voltage, a shifted ECL voltage, and a ground voltage; and selecting multiple threshold voltages of 0.8 volts, 1.5 volts, and 2.0 volts, each of which represents an event of interest.

13. A method of interpolating a discrete time series that represents voltages of a waveform, to determine a point at which the waveform crosses a threshold voltage, the method comprising the steps of:

upsampling the discrete time series to create an upsampled discrete time series;

determining a first digital word and a second digital word of the upsampled series of digital words that surround the threshold voltage;

performing linear interpolation between the first digital word and the second digital word to determine a time tag corresponding to the point at which the waveform crosses the threshold voltage;

wherein the waveform includes a plurality of cycles, each of the plurality of cycles having a rising edge and a falling edge, and wherein the step of upsampling includes the steps of:

providing a filter having characteristics that are optimized to accurately recreate the waveform at each rising edge and each falling edge; and inserting a digital word with a zero value between each adjacent pair of digital words in the series of digital words, to create a zero-valued series of digital words; and filtering the zero-valued series of digital words according to the filter, to create the upsampled series of digital words.

14. A method for analyzing time interval data of a waveform, comprising the steps of:

converting the waveform into a series of digital words, each word of the series of digital words representing a voltage of the waveform and a sample time at which the voltage occurred;

selecting an event of interest defined by a characteristic of the waveform;

interpolating the series of digital words to generate a time tag list, the time tag list including a series of time tags, each of the series of time tags representing a time at which the event of interest occurred during the waveform;

determining statistical properties of the time tag list; and displaying the time tag list and the statistical properties of the time tag list;

wherein the step of displaying includes displaying one of:

a time series line graph that includes occurrences of the event of interest;

a time series line graph that includes an amount that a subsequent occurrence of the event of interest deviated from a previous occurrence of the event of interest;

text representing a time series that includes occurrences of the event of interest;

text representing a time series that includes an amount that a subsequent occurrence of the event of interest deviated from a previous occurrence of the event of interest;

a histogram that includes occurrences of the event of interest; and a histogram that includes an amount that a subsequent occurrence of the event of interest deviated from a previous occurrence of the event of interest;

a jitter spectrum that includes the frequency components of jitter of the event of interest; and a jitter spectrum that includes the frequency components of an amount that a jitter for an event of interest deviated from a previous amount of jitter for the event of interest.

15. A method for analyzing time interval data of a waveform, comprising the steps of:

converting the waveform into a series of digital words, each word of the series of digital words representing a voltage of the waveform and a sample time at which the voltage occurred;

selecting an event of interest defined by a characteristic of the waveform;

interpolating the series of digital words to generate a time tag list, the time tag list including a series of time tags, each of the series of time tags representing a time at which the event of interest occurred during the waveform;

determining statistical properties of the time tag list; and displaying the time tag list and the statistical properties of the time tag list;

wherein the step of displaying includes displaying adjacent cycle data.

16. A method for analyzing time interval data of a waveform, comprising the steps of:

converting the waveform into a series of digital words, each word of the series of digital words representing a voltage of the waveform and a sample time at which the voltage occurred;

selecting an event of interest defined by a characteristic of the waveform;

interpolating the series of digital words to generate a time tag list, the time tag list including a series of time tags, each of the series of time tags representing a time at which the event of interest occurred during the waveform;

determining statistical properties of the time tag list; and displaying the time tag list and the statistical properties of the time tag list;

wherein the step of determining statistical properties includes determining at least one of:
a mean;
a standard deviation;
a largest negative slope displacement;
a largest positive slope displacement;
a maximum; and
a minimum.

17. A method for analyzing time interval data of a waveform, comprising the steps of:

converting the waveform into a series of digital words, each word of the series of digital words representing a voltage of the waveform and a sample time at which the voltage occurred;

selecting an event of interest defined by a characteristic of the waveform;

interpolating the series of digital words to generate a time tag list, the time tag list including a series of time tags, each of the series of time tags representing a time at which the event of interest occurred during the waveform;

generating locally synthesized data as a second series of digital words, each of the second series of digital words representing a voltage of an ideal waveform and a synthesized sample time corresponding to each voltage; and interpolating the second series of digital words to generate a second time tag list.

18. A method for analyzing time interval data of a waveform, comprising the steps of:

converting the waveform into a series of digital words, each word of the series of digital words representing a voltage of the waveform and a sample time at which the voltage occurred;

selecting an event of interest defined by a characteristic of the waveform; and interpolating the series of digital words to generate a time tag list, the time tag list including a series of time tags, each of the series of time tags representing a time at which the event of interest occurred during the waveform;

wherein the step of converting includes steps of converting a first waveform into a first series of digital words and converting a second waveform into a second series of digital words;

the step of interpolating includes interpolating the first series of digital words to create a first time tag list and interpolating the second series of digital words to create a second time tag list;

the method further including the steps of:
determining a first set of statistical properties of the time tag list;
determining a second set of statistical properties of the second time tag list;
providing inter-acquisition analysis by comparing the first set and second set of statistical properties, to generate a third set of statistical properties.

19. A method of interpolating a discrete time series that represents voltages of a waveform, to determine a point at which the waveform crosses a threshold voltage, the method comprising the steps of:

upsampling the discrete time series to create an upsampled discrete time series;

determining a first digital word and a second digital word of the upsampled series of digital words that surround the threshold voltage;

performing linear interpolation between the first digital word and the second digital word to determine a time tag corresponding to the point at which the waveform crosses the threshold voltage;

wherein the step of upsampling includes the steps of:
providing a low-pass filter that has a plurality of coefficients;
inserting a digital word with a zero value between each adjacent pair of digital words in the series of digital words, to create a zero-valued series of digital words; and
low-pass filtering the zero-valued series of digital words with the low-pass filter, to create the upsampled series of digital words.

20. The method of claim 19, wherein the waveform is sampled at a sampling frequency to generate the series of digital words, and wherein the step of providing a low-pass filter includes the steps of:

providing a 500 point low-pass filter having a pass band to 0.25 multiplied by the sampling frequency and a stop band beginning at 0.35 multiplied by the sampling frequency;

upsampling the 500 point low-pass filter with respect to itself to generate a 2500 point low-pass filter;

providing a 1000 point low-pass filter having a pass band to 0.25 multiplied by the sampling frequency and a stop band beginning at 0.4 multiplied by the sampling frequency; and upsampling the 2500 point filter with respect to a 1000 point filter to create a 25000 point filter that is the low-pass filter to be provided.

21. An apparatus for analyzing time interval data of a waveform with respect to an event of interest, comprising:

a measurement control unit, that has an input for receiving the waveform and an output providing an input file, the input file including a series of digital words, each of the series of digital words representing a voltage of the waveform and an input time at which the voltage occurred;

a time tag interpolator, having an input coupled to the measurement control unit for receiving the input file, and an output providing a time tag list according to an interpolation, the time tag list including a series of time tags, each of the series of time tags representing an output time at which the event of interest occurred during the waveform; and a results analyzer, having an input coupled to the time tag interpolator for receiving the time tag list, and an output that provides the series of time tags and statistics of the series of time tags;

wherein the time tag interpolator includes:
a low-pass filter having an input that receives the input file, for generating an upsampled interpolated data stream as an output; and
a linear interpolation filter having an input that receives the input file, for interpolating based on linear relationships between time tags;

a time tag generator, having an input that receives the upsampled interpolated data stream, for comparing the upsampled interpolated data stream with the event of interest to generate the time tag list.

22. The apparatus of claim 21, wherein the waveform has a sampling frequency, and wherein the low-pass filter includes:

a time optimal filter, including;
  a 500 point low-pass filter having a pass band to 0.25 multiplied by the sampling frequency and a stop band beginning at 0.35 multiplied by the sampling frequency;
  means for upsampling the 500 point low-pass filter with respect to itself to generate a 2500 point low-pass filter;
  a 1000 point low-pass filter having a pass band to 0.25 multiplied by the sampling frequency and a stop band beginning at 0.4 multiplied by the sampling frequency; and
  means for upsampling the 2500 point filter with respect to a 1000 point filter to create a 25000 point filter; and at least one hybrid filter that is a combination of the linear interpolation filter and the time optimal filter;

wherein the time tag interpolator further includes a filter selector to select one of the time optimal filter and the at least one hybrid filter.

23. The apparatus of claim 21, wherein the waveform includes a plurality of cycles, each of the plurality of cycles having a rising edge and a falling edge, and the low-pass filter is structured and arranged to accurately recreate each rising edge and each falling edge.

24. An apparatus for analyzing time interval data of a waveform with respect to an event of interest, comprising:

a measurement control unit, that has an input for receiving the waveform and an output providing an input file, the input file including a series of digital words, each of the series of digital words representing a voltage of the waveform and an input time at which the voltage occurred;

a time tag interpolator, having an input coupled to the measurement control unit for receiving the input file, and an output providing a time tag list according to an interpolation, the time tag list including a series of time tags, each of the series of time tags representing an output time at which the event of interest occurred during the waveform; and a results analyzer, having an input coupled to the time tag interpolator for receiving the time tag list, and an output that provides the series of time tags and statistics of the series of time tags, wherein the results analyzer includes:

an event processor having an input that receives the time tag list, for processing the time tag list with respect to the selected event of interest to generate data indicative of the event of interest as an output;

a statistical processor, having an input that receives the data indicative of the event of interest, for performing statistical analysis on the data indicative of the event of interest to generate statistical data as an output; and a display/output controller, coupled to the statistical processor and the event processor, having an input that receives the data indicative of the event of interest and the statistical data, and having an output that provides display data corresponding to the data indicative of the event of interest and the statistical data.

25. An apparatus for analyzing time interval data of a waveform with respect to an event of interest, comprising:

a measurement control unit, that has an input for receiving the waveform and an output providing an input file, the input file including a series of digital words, each of the series of digital words representing a voltage of the waveform and an input time at which the voltage occurred;

a time tag interpolator, having an input coupled to the measurement control unit for receiving the input file, and an output providing a time tag list according to an interpolation, the time tag list including a series of time tags, each of the series of time tags representing an output time at which the event of interest occurred during the waveform; and a results analyzer, having an input coupled to the time tag interpolator for receiving the time tag list, and an output that provides the series of time tags and statistics of the series of time tags;

wherein the time results analyzer includes means for displaying adjacent cycle analysis parameters.

* * * * *